US011284046B2

(12) United States Patent
Taguchi et al.

(10) Patent No.: US 11,284,046 B2
(45) Date of Patent: Mar. 22, 2022

(54) IMAGING ELEMENT AND IMAGING DEVICE FOR CONTROLLING POLARIZATION OF INCIDENT LIGHT

(71) Applicant: SONY SEMICONDUCTOR SOLUTIONS CORPORATION, Kanagawa (JP)

(72) Inventors: Yukari Taguchi, Kumamoto (JP); Shinichiro Noudo, Kumamoto (JP); Tomohiro Yamazaki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/051,656

(22) PCT Filed: Feb. 5, 2019

(86) PCT No.: PCT/JP2019/003970
§ 371 (c)(1),
(2) Date: Oct. 29, 2020

(87) PCT Pub. No.: WO2019/220696
PCT Pub. Date: Nov. 21, 2019

(65) Prior Publication Data
US 2021/0160463 A1  May 27, 2021

(30) Foreign Application Priority Data

May 14, 2018  (JP) .............................. JP2018-092687

(51) Int. Cl.
*H04N 9/04*  (2006.01)
(52) U.S. Cl.
CPC ......... *H04N 9/0455* (2018.08); *H04N 9/0451* (2018.08)

(58) Field of Classification Search
CPC ........................... H04N 9/0451; H04N 9/0455
See application file for complete search history.

(56) References Cited

U.S. PATENT DOCUMENTS

2010/0282945 A1  11/2010  Yokogawa
2012/0319222 A1  12/2012  Ozawa et al.
(Continued)

FOREIGN PATENT DOCUMENTS

BR  112012011113 A2  7/2016
CN  101887900 A  11/2010
(Continued)

OTHER PUBLICATIONS

International Search Report and Written Opinion of PCT Application No. PCT/JP2019/003970, dated Apr. 23, 2019, 09 pages of ISRWO.

(Continued)

*Primary Examiner* — Antoinette T Spinks
(74) *Attorney, Agent, or Firm* — Chip Law Group

(57) ABSTRACT

A decrease in strength is reduced of a polarizer of an imaging element in which the polarizer that detects polarization information of a subject is arranged. The imaging element includes a plurality of pixels. The plurality of pixels included in the imaging element each includes a color filter that transmits light having a predetermined wavelength of incident light and a polarizer that performs polarization of the incident light, and generates an image signal based on the incident light transmitted through the color filter and the polarizer. The polarizer included in each of the plurality of pixels adjusts the polarization depending on the color filter in a corresponding one of the pixels of the imaging element.

10 Claims, 20 Drawing Sheets

(56) References Cited

U.S. PATENT DOCUMENTS

| | | |
|---|---|---|
| 2013/0063569 A1 | 3/2013 | Sato et al. |
| 2018/0277584 A1 | 9/2018 | Maruyama |

FOREIGN PATENT DOCUMENTS

| | | |
|---|---|---|
| CN | 102402106 A | 4/2012 |
| CN | 202454558 U | 9/2012 |
| CN | 102948141 A | 2/2013 |
| CN | 105355637 A | 2/2016 |
| CN | 108028260 A | 5/2018 |
| EP | 2252069 A2 | 11/2010 |
| EP | 2579568 A1 | 4/2013 |
| EP | 2615640 A1 | 7/2013 |
| JP | 2010-263158 A | 11/2010 |
| JP | 2012-009539 A | 1/2012 |
| JP | 2012-080065 A | 4/2012 |
| JP | 2012-230341 A | 11/2012 |
| JP | 2014-077972 A | 5/2014 |
| JP | 5682437 B2 | 3/2015 |
| JP | 2016-219500 A | 12/2016 |
| JP | 2017-076684 A | 4/2017 |
| JP | 6903396 B2 | 7/2021 |
| KR | 10-2010-0122058 A | 11/2010 |
| KR | 10-2013-0100891 A | 9/2013 |
| KR | 10-2013-0101972 A | 9/2013 |
| TW | 201106470 A | 2/2011 |
| TW | 201222008 A | 6/2012 |
| WO | 2011/148851 A1 | 12/2011 |
| WO | 2012/032939 A1 | 3/2012 |
| WO | 2017/064845 A1 | 4/2017 |

OTHER PUBLICATIONS

Extended European Search Report of EP Application No. 19804228.5, dated Sep. 28, 2021, 10 pages.

IMAGING ELEMENT AND IMAGING DEVICE FOR CONTROLLING POLARIZATION OF INCIDENT LIGHT

CROSS REFERENCE TO RELATED APPLICATIONS

This application is a U.S. National Phase of International Patent Application No. PCT/JP2019/003970 filed on Feb. 5, 2019, which claims priority benefit of Japanese Patent Application No. JP 2018-092687 filed in the Japan Patent Office on May 14, 2018. Each of the above-referenced applications is hereby incorporated herein by reference in its entirety.

TECHNICAL FIELD

The present disclosure relates to an imaging element and an imaging device. Specifically, the present disclosure relates to an imaging element and an imaging device that detect polarization information of a subject.

BACKGROUND ART

An imaging element has conventionally been used that detects polarization information of incident light by arranging a polarizer that polarizes the incident light by transmitting light having a specific polarization direction for each pixel and performing photoelectric conversion. Image processing is performed on the basis of the detected polarization information, whereby, for example, a three-dimensional shape of a subject can be easily grasped. This is because reflected light from an object has a polarized component in a different direction for each surface of the object, so that it is possible to easily acquire a shape of the surface of the object by selecting the polarization direction and capturing an image. Furthermore, in an imaging element used for a monitoring device or the like, use is possible for removing an image reflected in a windshield of a car. This is because the image reflected in the windshield of the car is strongly polarized in a specific direction and can be easily removed by acquiring polarization information.

As such a polarizer, an imaging element is used in which a wire grid polarization element having a line-and-space structure is arranged. This is a polarizer including a plurality of strip-shaped conductors arranged at a pitch smaller than a wavelength of incident light. Furthermore, an insulator is arranged between the strip-shaped conductors. Incident light is attenuated that has a polarization direction perpendicular to an arrangement direction of the plurality of strip-shaped conductors. This is because free electrons of the strip-shaped conductors vibrate depending on the incident light and cancel the incident light. On the other hand, with incident light having a polarization direction parallel to the arrangement direction of the plurality of stripe-shaped conductors, vibration of the free electrons of the stripe-shaped conductors is relatively small, so that the amount of attenuation of the incident light is reduced. For this reason, the incident light having the polarization direction parallel to the arrangement direction of the plurality of strip-shaped conductors is transmitted through the polarizer. Here, a value obtained by dividing the refractive index of the insulator arranged between the plurality of strip-shaped conductors by the volume of the insulator is referred to as an average refractive index, and as the average refractive index is smaller, the transmittance of the polarizer is increased.

As such an imaging element, for example, an imaging element is used in which air is adopted as the insulator arranged between the plurality of strip-shaped conductors and the transmittance is improved (for example, see Patent Document 1).

CITATION LIST

Patent Document

Patent Document 1: Japanese Patent Application Laid-Open No. 2017-076684

SUMMARY OF THE INVENTION

Problems to be Solved by the Invention

In the above-described conventional technology, there is a problem that the strength is decreased since there is a gap between the plurality of strip-shaped conductors. That is, since the mechanical strength of the strip-shaped conductor is insufficient, there is a problem that the strip-shaped conductor is likely to be damaged in the manufacturing process of the polarizer, and the like.

The present disclosure has been made in view of the above-described problems, and an object thereof is to reduce the decrease in strength of the polarizer arranged in the imaging element.

Solutions to Problems

The present disclosure has been made to solve the above-described problems, and a first aspect thereof is an imaging element including a plurality of pixels each including a color filter that transmits light having a predetermined wavelength of incident light and a polarizer that performs polarization of the incident light, and generating an image signal based on the incident light transmitted through the color filter and the polarizer, in which the polarizer adjusts the polarization depending on the color filter in a corresponding one of the pixels of the imaging element.

Furthermore, in the first aspect, the polarizer may adjust the polarization depending on a wavelength of the incident light transmitted through the color filter.

Furthermore, in the first aspect, the polarizer may adjust the polarization by changing an extinction ratio.

Furthermore, in the first aspect, the polarizer may adjust the polarization by changing a transmittance of the incident light.

Furthermore, in the first aspect, the polarizer may include a wire grid including a plurality of strip-shaped conductors arranged at a predetermined pitch.

Furthermore, in the first aspect, the polarizer may adjust the polarization by changing the predetermined pitch.

Furthermore, in the first aspect, the polarizer may adjust the polarization by changing a width of the strip-shaped conductor.

Furthermore, in the first aspect, the polarizer may adjust the polarization by changing a height of the strip-shaped conductor.

Furthermore, in the first aspect, the polarizer may include an insulator arranged between the strip-shaped conductors adjacent to each other, and adjust the polarization by changing a refractive index of the insulator.

Furthermore, in the first aspect, the polarizer may include a gap between the strip-shaped conductors adjacent to each other.

Furthermore, a second aspect of the present disclosure is an imaging device including: a plurality of pixels each including a color filter that transmits light having a predetermined wavelength of incident light and a polarizer that performs polarization of the incident light, and generating an image signal based on the incident light transmitted through the color filter and the polarizer; and a processing circuit that processes the generated image signal, in which the polarizer adjusts the polarization depending on the color filter in a corresponding one of the pixels of the imaging device.

According to the above-described aspects, an action is obtained that the polarization in the polarizer is adjusted depending on the color filter arranged in each pixel. It is assumed that the shape of the polarizer is optimized depending on the characteristics of the color filter, and that the strength of the polarizer is improved accordingly.

Effects of the Invention

According to the present disclosure, an excellent effect is obtained of reducing the decrease in strength of the polarizer arranged in the imaging element.

MODE FOR CARRYING OUT THE INVENTION

Figure 1:
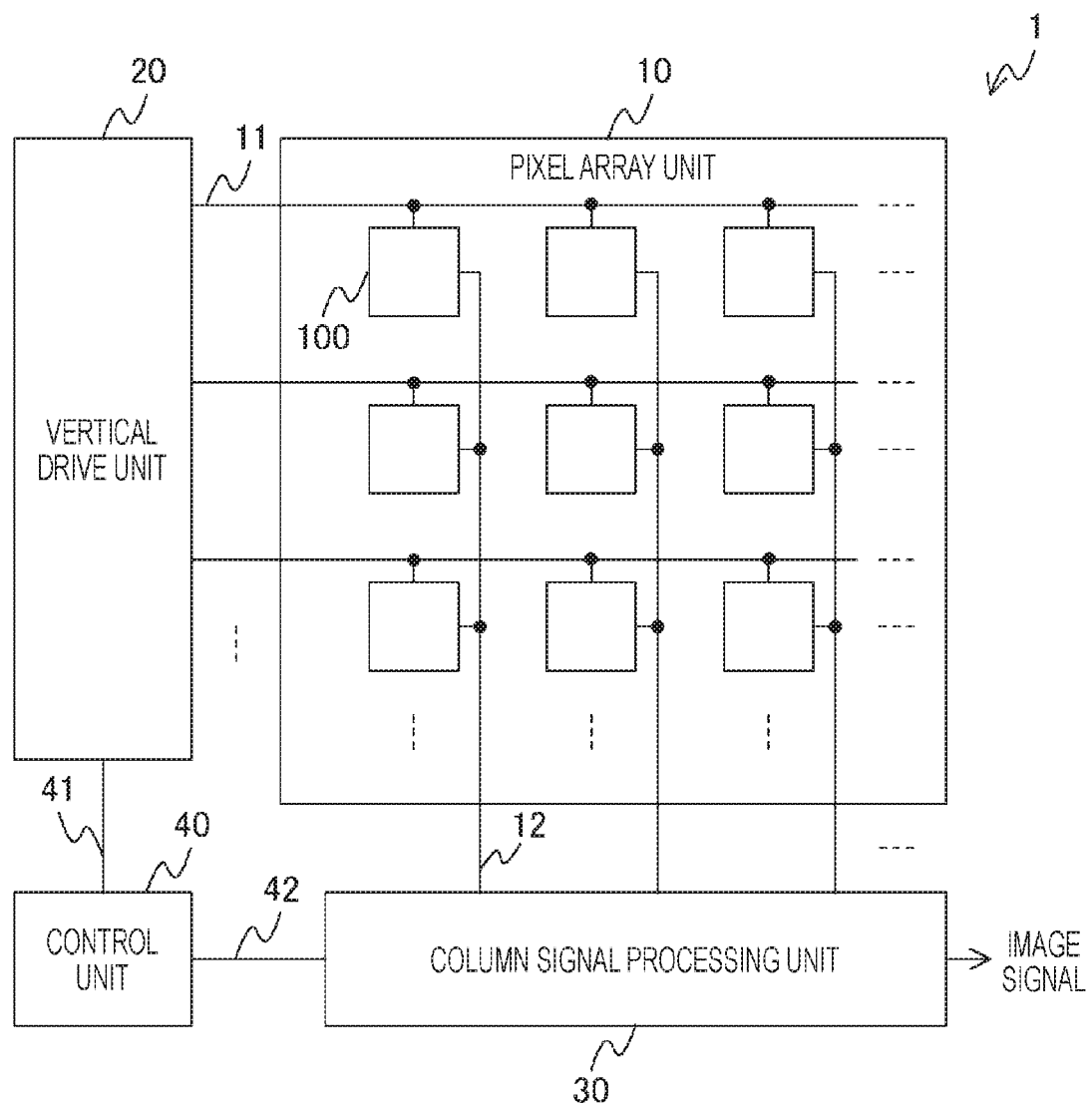
FIG. 1 is a diagram illustrating a configuration example of an imaging element according to an embodiment of the present disclosure.

Next, a mode for carrying out the present disclosure (hereinafter, referred to as an embodiment) will be described with reference to the drawings. In the drawings below, the same or similar portions are denoted by the same or similar reference numerals. However, the drawings are schematic, and dimensional ratios and the like of respective portions do not always match actual ones. Furthermore, it goes without saying that portions are included where dimensional relationships and ratios are different between the drawings. Furthermore, embodiments will be described in the following order.

1. First Embodiment
2. Second Embodiment
3. Third Embodiment
4. Fourth Embodiment
5. Fifth Embodiment
6. Sixth Embodiment
7. Application example to camera
8. Application example to endoscopic surgical system
9. Application example to mobile body 1. First Embodiment

[Configuration of Imaging Element]

FIG. 1 is a diagram illustrating a configuration example of an imaging element according to an embodiment of the present disclosure. An imaging element 1 illustrated in the figure includes a pixel array unit 10, a vertical drive unit 20, a column signal processing unit 30, and a control unit 40.

The pixel array unit 10 includes pixels 100 arranged in a two-dimensional lattice. Here, each pixel 100 generates an image signal depending on light emitted thereto. The pixel 100 includes a photoelectric conversion unit that generates charge depending on the light emitted thereto. Furthermore, the pixel 100 further includes a pixel circuit. The pixel circuit generates the image signal based on the charge generated by the photoelectric conversion unit. The generation of the image signal is controlled by a control signal generated by the vertical drive unit 20 described later. In the pixel array unit 10, signal lines 11 and 12 are arranged in an XY matrix. The signal line 11 is a signal line that transmits the control signal for the pixel circuit in the pixel 100, is arranged for each row of the pixel array unit 10, and is commonly wired to the pixels 100 arranged in each row. The signal line 12 is a signal line that transmits the image signal generated by the pixel circuit of the pixel 100, is arranged for each column of the pixel array unit 10, and is commonly wired to the pixels 100 arranged in each column. These photoelectric conversion unit and pixel circuit are formed on a semiconductor substrate.

The vertical drive unit 20 generates the control signal for the pixel circuit of the pixel 100. The vertical drive unit 20 transmits the control signal generated to the pixel 100 via the signal line 11 in the figure. The column signal processing unit 30 processes the image signal generated by the pixel 100. The column signal processing unit 30 processes the image signal transmitted from the pixel 100 via the signal line 12 in the figure. The processing in the column signal processing unit 30 corresponds to, for example, analog-to-digital conversion for converting an analog image signal generated in the pixel 100 into a digital image signal. The image signal processed by the column signal processing unit 30 is output as an image signal of the imaging element 1. The control unit 40 controls the entire imaging element 1. The control unit 40 controls the imaging element 1 by generating and outputting control signals for controlling the vertical drive unit 20 and the column signal processing unit 30. The control signals generated by the control unit 40 are transmitted to the vertical drive unit 20 and the column signal processing unit 30 via signal lines 41 and 42, respectively.

[Configuration of Imaging Element]

Figure 2:
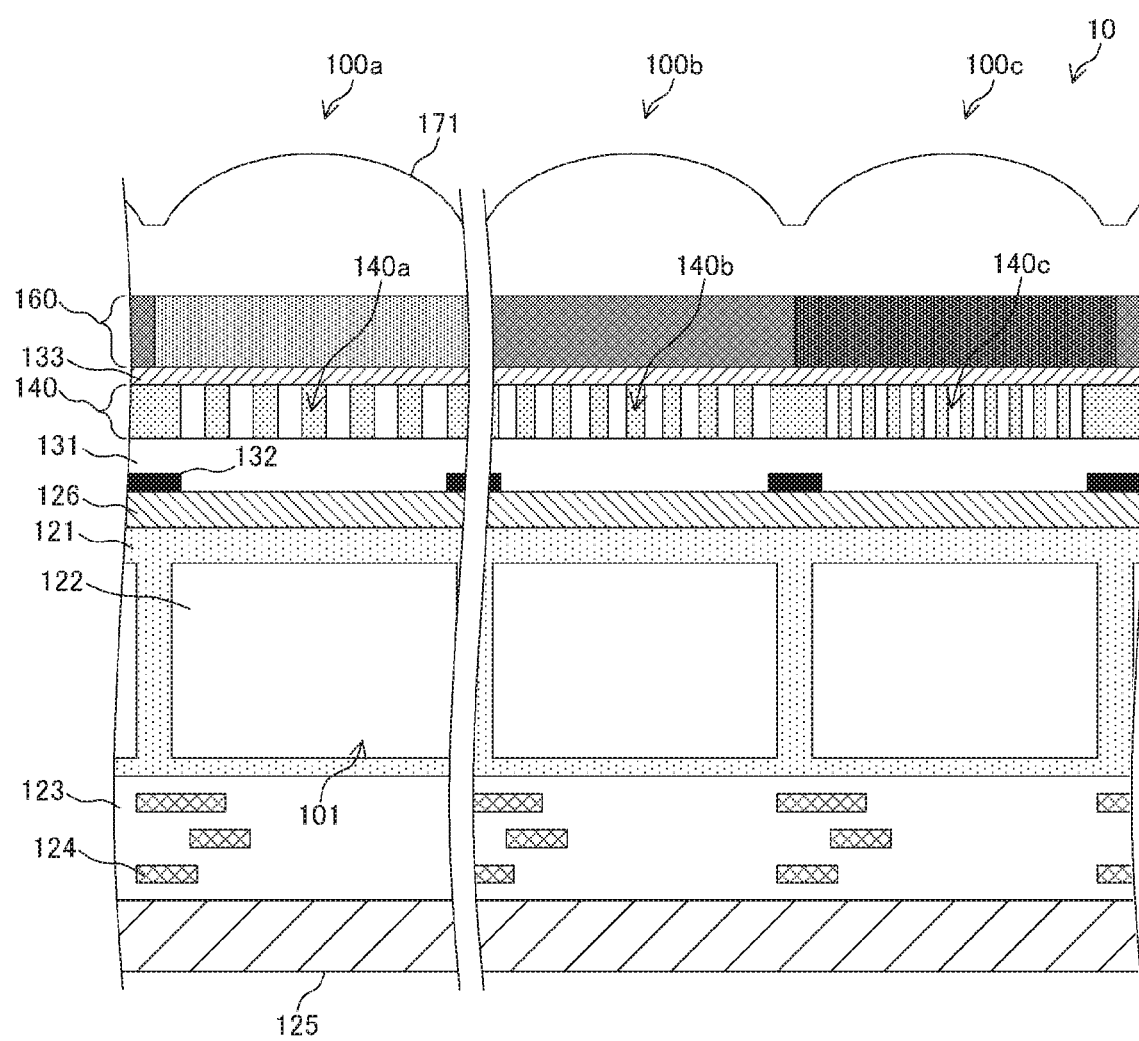
FIG. 2 is a cross-sectional view illustrating the configuration example of the imaging element according to the embodiment of the present disclosure.

FIG. 2 is a cross-sectional view illustrating the configuration example of the imaging element according to the embodiment of the present disclosure. The figure is a cross-sectional view illustrating a configuration example of the pixel 100 arranged in the pixel array unit 10 of the imaging element 1. The pixel 100 in the figure includes a semiconductor substrate 121, an insulating layer 123, a wiring layer 124, an insulating film 126, a light-shielding film 132, a base insulating layer 131, a polarizer 140, a planarizing film 133, a color filter 160, and an on-chip lens 171. Furthermore, the pixel 100 in the figure further includes a support substrate 125. The support substrate 125 is a substrate that supports the imaging element 1, and is a substrate that improves the strength of the imaging element 1 in the manufacturing process of the imaging element 1.

Note that, three pixels 100, a red pixel 100a, a green pixel 100b, and a blue pixel 100c, are arranged in the pixel array unit 10 in the figure. The red pixel 100a, the green pixel 100b, and the blue pixel 100c are the pixels 100 corresponding to red light, green light, and blue light, respectively, and different polarizers 140 and color filters 160 are arranged thereon, respectively.

The semiconductor substrate 121 is a semiconductor substrate on which semiconductor portions of elements of the photoelectric conversion unit and the pixel circuit of the pixel 100 are formed. Furthermore, on the semiconductor substrate 121, elements of the vertical drive unit 20, the column signal processing unit 30, and the control unit 40 described in FIG. 1 are further formed. Among these, the photoelectric conversion unit 101 is illustrated in the figure. For example, a p-type well region is formed in the semiconductor substrate 121, and the semiconductor portions of the elements described above are formed in the well region. For convenience, it is assumed that the semiconductor substrate 121 in the figure is configured in the well region. The photoelectric conversion unit 101 in the figure includes an n-type semiconductor region 122 formed in the well region and the p-type well region around the n-type semiconductor region 122. A photodiode is formed by a pn junction between the n-type semiconductor region 122 and the p-type well region. The photodiode corresponds to the photoelectric conversion unit 101, and generates charge by photoelectric conversion when irradiated with incident light. The charge generated by the photoelectric conversion unit 101 is converted into an image signal by a pixel circuit (not illustrated).

The wiring layer 124 is a wiring line that transmits an image signal generated by the pixel 100 and a control signal for the pixel 100. The wiring layer 124 can include a metal such as copper (Cu). The wiring lines 11 and 12 described in FIG. 1 include the wiring layer 124. The insulating layer 123 insulates the wiring layer 124. The insulating layer can include, for example, silicon oxide ($SiO_2$) or silicon nitride (SiN). Note that, the insulating layer 123 and the wiring layer 124 constitute a wiring region. The wiring region is formed on the front surface side of the semiconductor substrate 121.

The insulating film 126 is a film that insulates the semiconductor substrate 121. The insulating film 126 includes, for example, $SiO_2$, and insulates the back surface side of the semiconductor substrate 121. The light-shielding film 132 is a film that shields the incident light. The light-shielding film 132 is arranged at the boundary between the pixels 100 and shields the light obliquely incident from the adjacent pixels 100. The base insulating layer 131 is an insulating layer serving as a base of the polarizer 140 described later. The base insulating layer 131 can include, for example, $SiO_2$.

The color filter 160 is a filter that transmits light having a predetermined wavelength of the incident light of the pixel 100. That is, the color filter 160 is an optical filter that selects the incident light to be transmitted depending on the wavelength. As the color filter 160, for example, three types of the color filters 160 can be used that transmit red light (wavelength 700 nm), green light (wavelength 546 nm), and blue light (436 nm). In the red pixel 100a, the green pixel 100b, and the blue pixel 100c in the figure, the color filters 160 that transmit the red light, the green light, and the blue light are arranged, respectively. The planarizing film 133 is a film that planarizes a surface on which the color filter 160 is formed. The planarizing film 133 can include, for example, an acrylic resin. The on-chip lens 171 is a lens that focuses the incident light. The on-chip lens 171 in the figure focuses the incident light on the photoelectric conversion unit 101 via the color filter 160 and the polarizer 140.

The polarizer 140 performs polarization of the incident light. The polarizer 140 performs the polarization of the incident light by transmitting light having a specific polarization direction of the incident light. Usually, light from a subject includes a plurality of light beams polarized in different directions. By imaging the light in the specific polarization direction among these light beams and generating an image signal, an amount of light having the polarization direction can be acquired. By performing this for a plurality of the polarization directions, it is possible to grasp polarization information such as how the light from the subject is polarized. On the basis of the polarization information, it is possible to perform grasping of a three-dimensional shape of the subject, and the like. As described later, the polarizer 140 in the figure polarizes the incident light in four polarization directions different from each other in angle by 45 degrees.

Furthermore, the polarizer 140 in the figure adjusts the polarization depending on the color filter 160 arranged in the pixel 100. Polarizers 140a, 140b, and 140c are respectively arranged in the red pixel 100a, the green pixel 100b, and the blue pixel 100c in the figure. As described above, the three types of the color filters 160 are arranged in the red pixel 100a, the green pixel 100b, and the blue pixel 100c. The polarizer 140 adjusts the polarization depending on the wavelength of the incident light transmitted through the color filter 160 arranged in the pixel 100, for example. The adjustment of the polarization can be performed, for example, by changing an extinction ratio of the polarizer 140. Furthermore, for example, it can be performed by changing a transmittance of the polarizer 140.

Here, the extinction ratio is a ratio between the maximum transmitted light and the minimum transmitted light of the transmitted light of the polarizer 140. As described above, the polarizer 140 in the figure transmits the light having the specific polarization direction. On the other hand, the polarizer 140 attenuates light having a polarization direction different from the specific polarization direction. Transmitted light having a polarization direction different by 90 degrees from the specific polarization direction has the maximum amount of attenuation. The extinction ratio is a ration between the maximum value and the minimum value of such transmitted light. As the extinction ratio is higher, it is possible to acquire polarization information with less noise. On the other hand, as the extinction ratio is higher, the transmittance of the polarizer 140 is decreased. Then, the extinction ratio and the transmittance change depending on the wavelength of light. Thus, the extinction ratio and the transmittance of the polarizer 140 are changed depending on the wavelength of the incident light selected by the color filter 160, and the polarization of the polarizer 140 is adjusted.

The polarizer 140 can include a wire grid, for example. Here, the wire grid is a polarizer including a plurality of strip-shaped conductors arranged at a predetermined pitch, as described above. Here, the stripe-shaped conductor is a conductor having a linear shape or a rectangular parallelepiped. When light is incident on the polarizer 140 including such a conductor, free electrons in the conductor vibrate depending on the incident light. At this time, of the incident light of the polarizer 140, light polarized in a direction perpendicular to a direction in which the plurality of strip-shaped conductors is arranged, that is, a direction parallel to the longitudinal direction of the strip-shaped conductor vibrates the free electrons in the longitudinal direction of the strip of the strip-shaped conductor. For this reason, the incident light perpendicular to the direction in which the plurality of strip-shaped conductors is arranged is canceled by the light generated by the vibration of the free electrons, cannot be transmitted through the polarizer 140, and is reflected by the polarizer 140. On the other hand, the incident light having a polarization direction parallel to the direction in which the plurality of strip-shaped conductors of the polarizer 140 is arranged, that is, a polarization direction perpendicular to the longitudinal direction of the strip-shaped conductor vibrates the free electrons in the short side direction of the strip of the strip-shaped conductor. In this case, since the intensity of the light due to the vibration of the free electrons is lowered, the incident light having the polarization direction has a smaller attenuation by the polarizer 140, and can be transmitted through the polarizer 140.

The polarizers 140a, 140b, and 140c in the figure have different arrangement pitches of the strip-shaped conductors. The details of a configuration of the polarizer 140 will be described later.

Note that, the configuration of the imaging element 1 is not limited to this example. For example, it is also possible to use complementary color filters of cyan, magenta, and yellow for the color filters 160. Furthermore, for example, it is also possible to use a color filter corresponding to light other than visible light such as ultraviolet light or infrared light. Furthermore, it can also be applied to a front-illuminated imaging element.

[Configuration of Polarizer]

Figure 3:
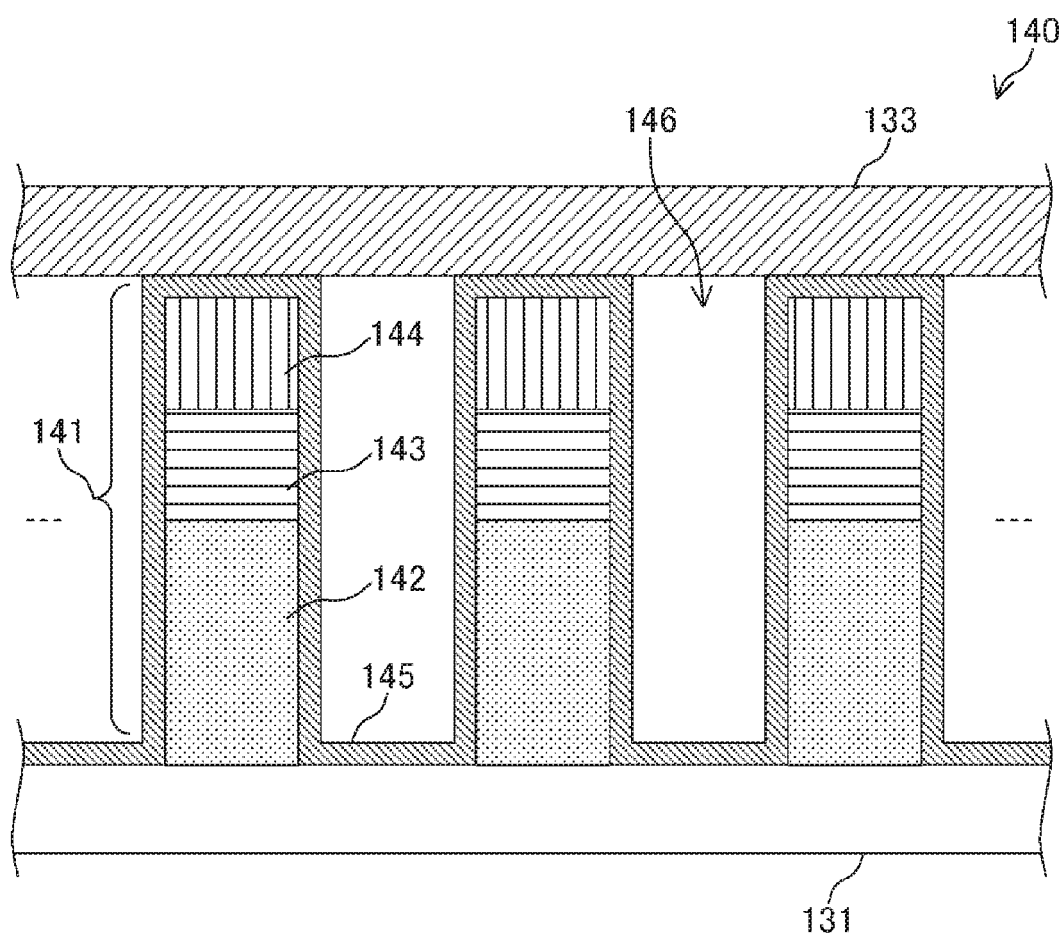
FIG. 3 is a diagram illustrating a configuration example of a polarizer according to the embodiment of the present disclosure.

FIG. 3 is a diagram illustrating a configuration example of the polarizer according to the embodiment of the present disclosure. The figure is a cross-sectional view illustrating a configuration example of the polarizer 140. The polarizer 140 in the figure is arranged between the base insulating layer 131 and the planarizing film 133, and includes a light-reflecting layer 142, an insulating layer 143, a light-absorbing layer 144, and a protective layer 145.

The light-reflecting layer 142 reflects incident light and corresponds to the above-described strip-shaped conductor. The light-reflecting layer 142 can include an inorganic material having conductivity. For example, the light-reflecting layer 142 can include a metal material such as Al, silver (Ag), gold (Au), Cu, platinum (Pt), molybdenum (Mo), chromium (Cr), titanium (Ti), nickel (Ni), W, iron (Fe), and tellurium (Te). Furthermore, for example, the light-reflecting layer 142 can include an alloy containing these metals, and a semiconductor material such as silicon (Si) and germanium (Ge). Note that, the light-reflecting layer 142 is an example of the strip-shaped conductor described in the claims.

The light-absorbing layer 144 absorbs incident light. The light-absorbing layer 144 can include a material similar to that of the light-reflecting layer 142, but it is preferable to use a material having a high absorption coefficient for the incident light.

The insulating layer 143 is an insulator including, for example, $SiO_2$. The insulating layer 143 is arranged between the light-reflecting layer 142 and the light-absorbing layer 144, and adjusts a phase of light reflected by the light-reflecting layer 142. Specifically, the insulating layer 143 adjusts the phase of the light reflected by the light-reflecting layer 142 to an opposite phase from that of light reflected by the light-absorbing layer 144. Since the light whose phase is adjusted by the insulating layer 143 and the light reflected by the light-absorbing layer 144 have opposite phases, they are attenuated by interference. As a result, reflection of light by the polarizer 140 can be reduced. Furthermore, the insulating layer 143 also has a role as a base of the light-absorbing layer 144.

The light-reflecting layer 142, the insulating layer 143, and the light-absorbing layer 144 that are sequentially laminated are arranged at a predetermined pitch. The laminated light-reflecting layer 142, insulating layer 143, and light-absorbing layer 144 are hereinafter referred to as a light-shielding line 141. A gap 146 is arranged between the adjacent light-shielding lines 141. The gap 146 can be formed by filling a gas such as air between the adjacent light-shielding lines 141. Furthermore, the gap 146 can also be formed by making a vacuum state between the adjacent light-shielding lines 141. As a result, the transmittance of the polarizer 140 can be improved.

The protective layer 145 protects the light-shielding line 141. The protective layer 145 can include, for example, $SiO_2$.

Such a polarizer 140 can be formed as follows. First, material metals and the like of the light-reflecting layer 142, the insulating layer 143, and the light-absorbing layer 144 are sequentially laminated on a surface of the base insulating layer 131. Next, the light-shielding line 141 is formed by etching in a shape of the strip-shaped conductor. The etching can be performed by, for example, dry etching. Next, the protective layer 145 is formed on surfaces of the light-shielding lines 141, the planarizing film 133 is formed to close spaces between the light-shielding lines 141, to form the gap 146. The planarizing film 133 can be formed by, for example, Chemical Vapor Deposition (CVD). The polarizer 140 can be formed by the above steps.

Since there is a gap between the light-shielding lines 141, the strength of the polarizer 140 is decreased. When the polarizer 140 described above is formed, a defect may occur in the polarizer 140. In particular, when the width of the light-shielding line 141 is fine, the light-shielding line 141 is easily peeled off, collapsed, or bent. As described above, since the polarizer 140 transmits and reflects the incident light by vibrating the free electrons of the strip-shaped conductor induced by the incident light, the pitch of the light-shielding lines 141 needs to be smaller than the wavelength of the incident light. Since the blue light having the shortest wavelength of the incident light transmitted through the color filter 160 has a wavelength of 436 nm, it is necessary to form the pitch of the light-shielding lines 141 matched to the wavelength in a size of about 100 nm. As described above, the polarizer 140 has a fine shape, so that the strength is decreased and the yield in the manufacturing process is decreased.

Thus, the pitch and the like of the light-shielding lines 141 in the polarizer 140 are changed depending on the wavelength of the light incident on the polarizer 140. Specifically, the pitch of the light-shielding lines 141 of the polarizer 140 arranged in the green pixel 100b and the red pixel 100a is made larger than the pitch of the light-shielding lines 141 of the polarizer 140c arranged in the blue pixel 100c. As a result, it is possible to reduce a region in which the polarizer 140 having the fine shape is arranged.

Note that, the configuration of the polarizer 140 is not limited to this example. For example, it is possible to use the polarizer 140 including the light-shielding line 141 in which the insulating layer 143 and the light-absorbing layer 144 are omitted.

[Arrangement of Polarizer]

Figure 4:
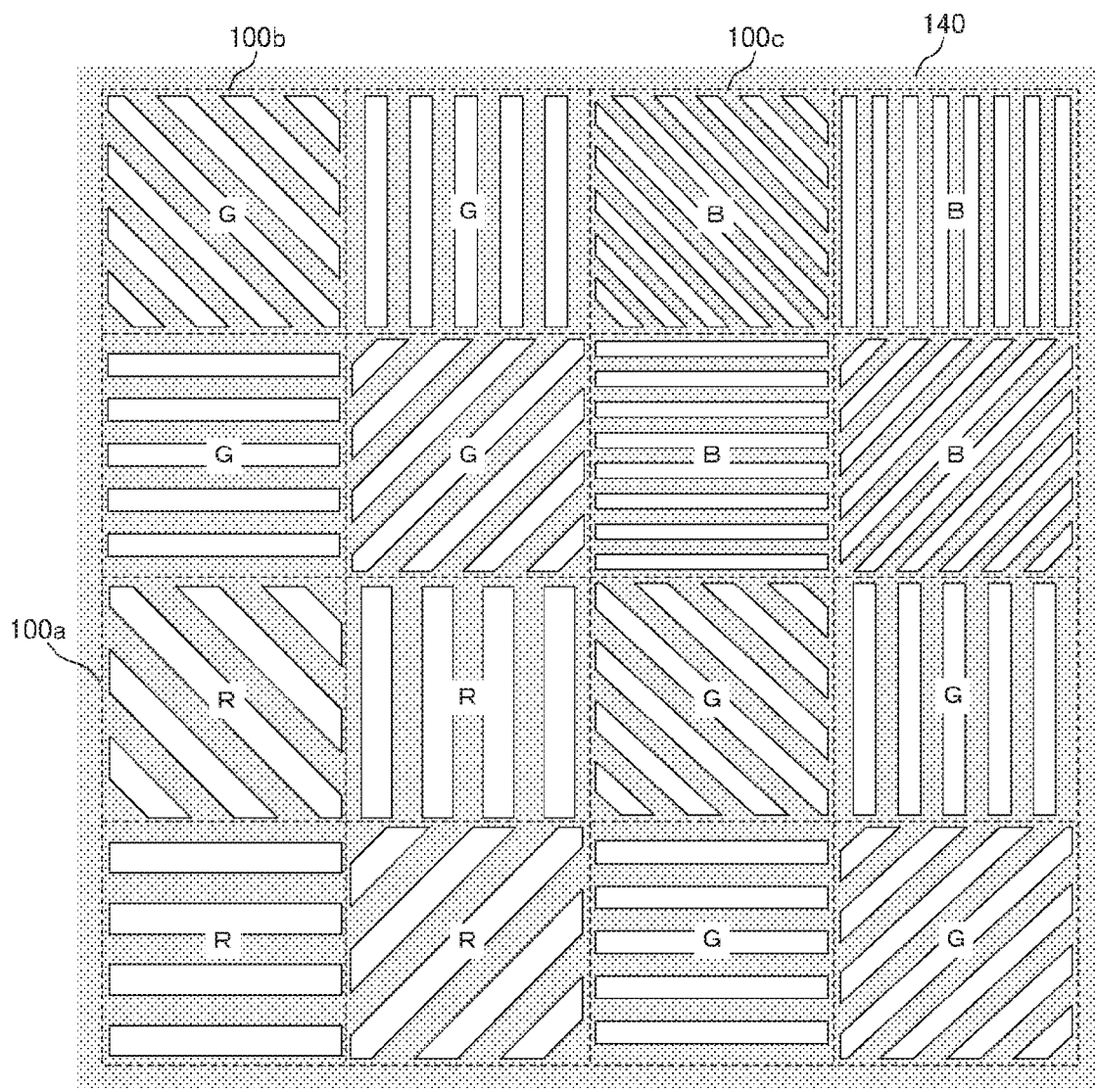
FIG. 4 is a diagram illustrating an arrangement example of the polarizer according to a first embodiment of the present disclosure.

FIG. 4 is a diagram illustrating an arrangement example of the polarizer according to a first embodiment of the present disclosure. The figure is a plan view illustrating an arrangement example of the polarizer 140 of the pixel 100 arranged in the pixel array unit 10. The hatched region in the figure represents the light-shielding line 141, and the white region represents the gap 146. The dotted rectangle in the figure represents the pixel 100. Furthermore, the letters in the figure represent the wavelength of the incident light corresponding to the pixel 100. Specifically, the pixels 100 to which "R", "G", and "B" are attached represent the red pixel 100a, the green pixel 100b, and the blue pixel 100c, respectively. The pixel array unit 10 in the figure illustrates an example in which four red pixels 100a, green pixels 100b, and blue pixels 100c arranged in two rows and two columns are arranged in a Bayer array. Furthermore, four polarizers 140 whose polarization directions are different from each other by 45 degrees are respectively arranged in the four pixels 100 arranged in two rows and two columns. As a result, it is possible to acquire four pieces of polarization information whose polarization directions are different from each other by 45 degrees for each of the red pixel 100a, the green pixel 100b, and the blue pixel 100c.

Furthermore, the polarizer 140 in the figure is formed with a different pitch for each of the red pixel 100a, the green pixel 100b, and the blue pixel 100c. Specifically, the polarizers 140a, 140b, and 140c arranged in the red pixel 100a, the green pixel 100b, and the blue pixel 100c, respectively, include light-shielding lines 141 having a larger pitch in this order.

Note that, the configuration of the polarizer 140 is not limited to this example. For example, a configuration can also be made in which two polarizers 140 are arranged whose polarization directions are different from each other by 90 degrees.

[Characteristics of Polarizer]

Figure 5A:
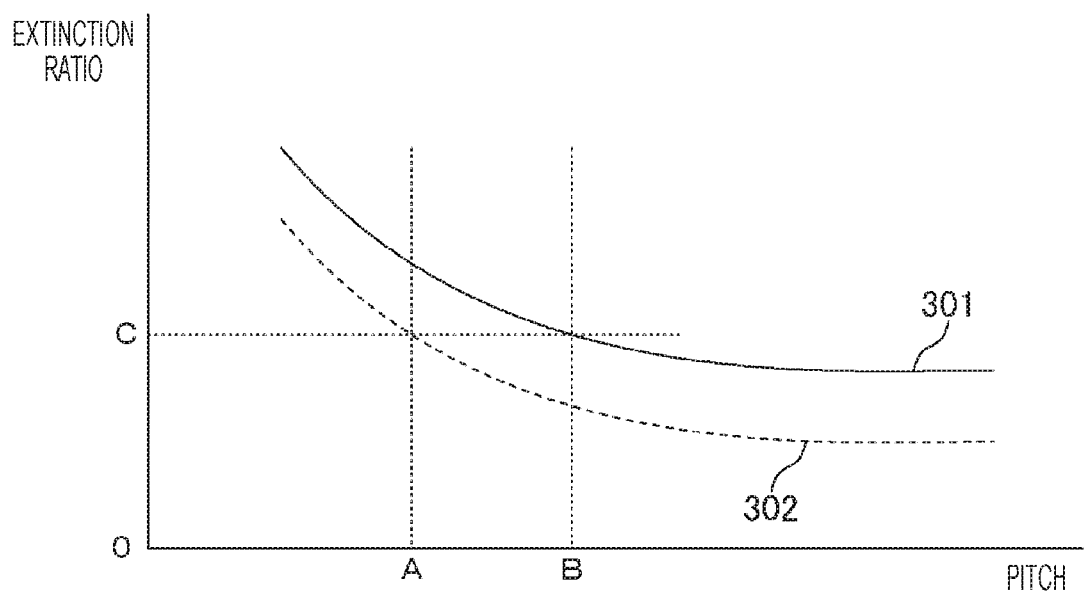
FIGS. 5A and 5B are diagrams illustrating an example of characteristics of the polarizer according to the first embodiment of the present disclosure.
Figure 5B:
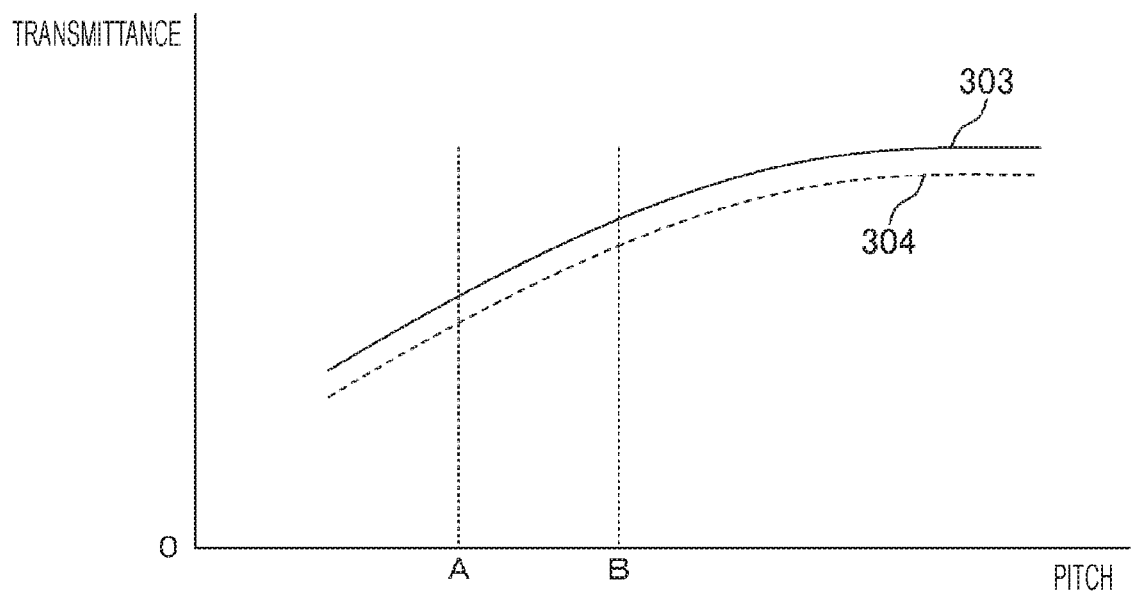

FIGS. 5A and 5B are diagrams illustrating an example of characteristics of the polarizer according to the first embodiment of the present disclosure. FIG. 5A is a diagram illustrating a relationship between the pitch of the light-shielding lines 141 (light-reflecting layers 142) of the polarizer 140 and the extinction ratio of the polarizer 140. In FIG. 5A, the horizontal axis and the vertical axis represent the pitch and the extinction ratio of the light-reflecting layer 142, respectively. Furthermore, the solid line in FIG. 5A is a graph (graph 301) illustrating a characteristic of light having a long wavelength (for example, green light), and the dotted line is a graph (graph 302) illustrating a characteristic of light having a short wavelength (for example, blue light). As illustrated in FIG. 5A, as the pitch of the light-reflecting layers 142 is larger, the extinction ratio is decreased. In the graphs 302 and 301, pitches of the light-reflecting layers 142 for obtaining an extinction ratio "C" are "A" and "B", respectively, and the pitch can be made larger as the wavelength is longer.

FIG. 5B is a diagram illustrating a relationship between the pitch of the light-reflecting layers 142 of the polarizer 140 and the transmittance of the polarizer 140. In FIG. 5B, the horizontal axis and the vertical axis represent the pitch and the transmittance of the light-reflecting layer 142, respectively. Furthermore, the solid line in FIG. 5B is a graph (graph 303) illustrating a characteristic of light having a long wavelength, and the dotted line is a graph (graph 304) illustrating a characteristic of light having a short wavelength. As illustrated in FIG. 5B, as the pitch of the light-reflecting layers 142 is larger, the transmittance is increased.

[Shape of Polarizer]

Figure 6A:
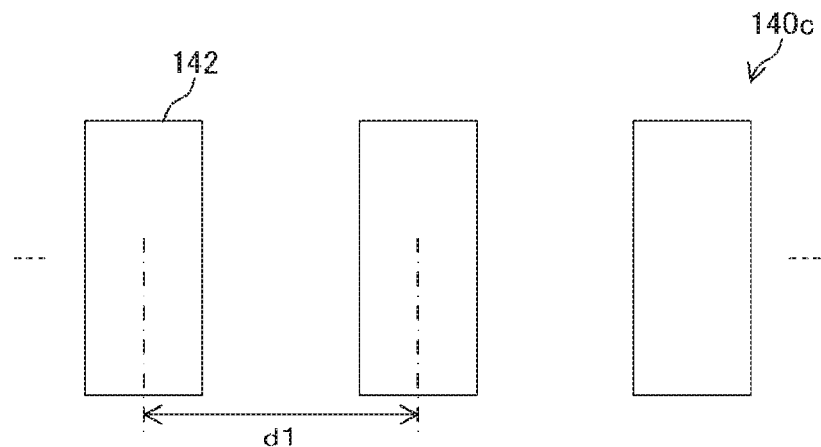
FIGS. 6A, 6B, and 6C are diagrams illustrating an example of a shape of the polarizer according to the first embodiment of the present disclosure.
Figure 6B:
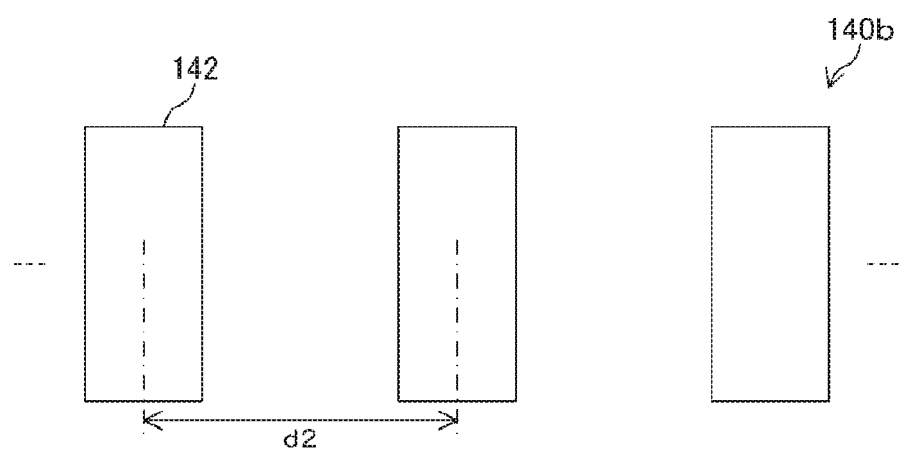
Figure 6C:
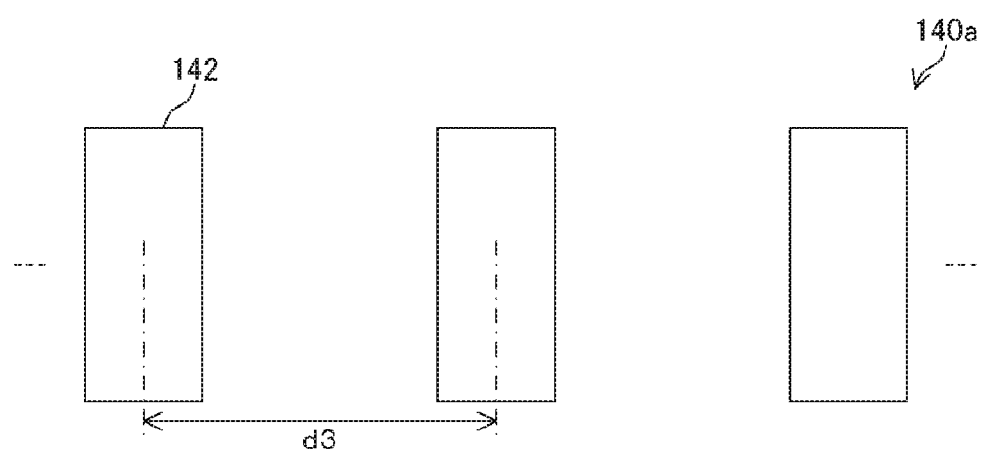

FIGS. 6A, 6B, and 6C are diagrams illustrating an example of a shape of the polarizer according to the first embodiment of the present disclosure. The figure is a diagram illustrating simplified cross-sectional shapes of the light-reflecting layers 142 described in FIG. 3. In the figure, FIGS. 6A, 6B, and 6C illustrate the light-reflecting layers 142 of the polarizer 140c, the polarizer 140b, and the polarizer 140a, respectively. As illustrated in the figure, the pitches of the light-reflecting layers 142 of the polarizer 140c, the polarizer 140b, and the polarizer 140a are d1, d2, and d3, respectively, and are smaller pitches in this order. The polarizer 140c of the blue pixel 100c is formed with a small pitch to match a short wavelength. As a result, the extinction ratio required in the blue pixel 100c can be obtained.

The polarizer 140b of the green pixel 100b is formed with a larger pitch than that of the polarizer 140c of the blue pixel 100c, and the polarizer 140a of the red pixel 100a has a larger pitch than that of the polarizer 140b. As described above, the polarizers each are formed with the pitch depending on the required extinction ratio, and the transmittance can be improved. By widening the pitches of the polarizers 140 of the green pixel 100b and the red pixel 100a, it is possible to narrow a region in which the polarizers 140 having narrow pitches and requiring fine processing are arranged, and improve the yield.

[Modifications]

In the imaging element 1 described above, the three polarizers 140 are arranged in the red pixel 100a, the green pixel 100b, and the blue pixel 100c, but a configuration can also be made in which two polarizers 140 are arranged.

Figure 7:
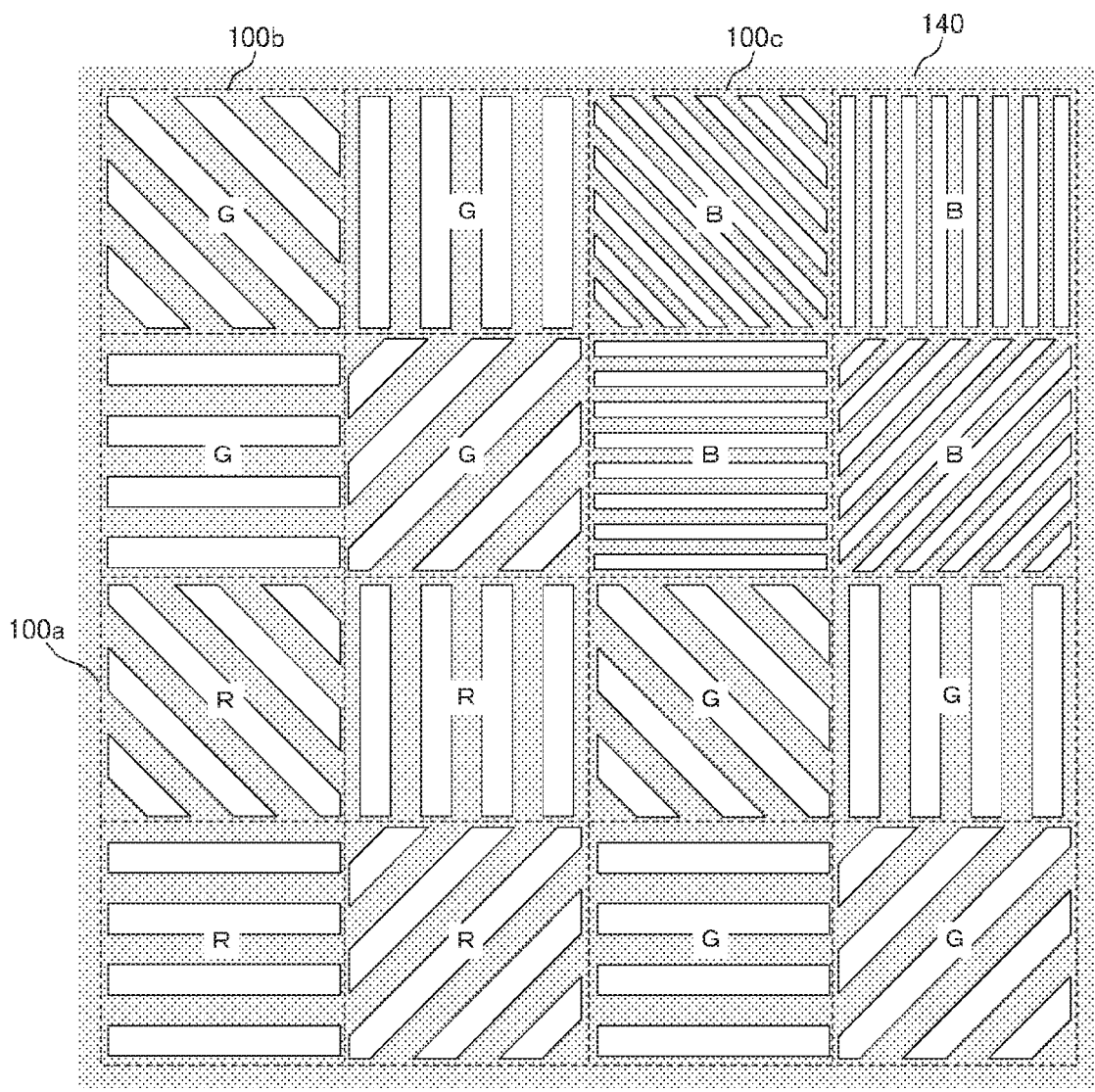
FIG. 7 is a diagram illustrating an arrangement example of the polarizer according to a first modification of the first embodiment of the present disclosure.

FIG. 7 is a diagram illustrating an arrangement example of the polarizer according to a first modification of the first embodiment of the present disclosure. Similar to FIG. 4, the figure is a plan view illustrating an arrangement example of the polarizer 140 of the pixel 100 arranged in the pixel array unit 10. The pixel 100 in the figure illustrates an example in which the polarizers 140 formed with the same pitch are arranged in the red pixel 100a and the green pixel 100b. Furthermore, the polarizers 140 of the red pixel 100a and the green pixel 100b are formed with the pitch larger than that of the polarizers 140 of the blue pixel 100c. With such an arrangement, the required extinction ratio can be secured in the blue pixel 100c, while the transmittance can be improved in the red pixel 100a and the green pixel 100b.

Figure 8:
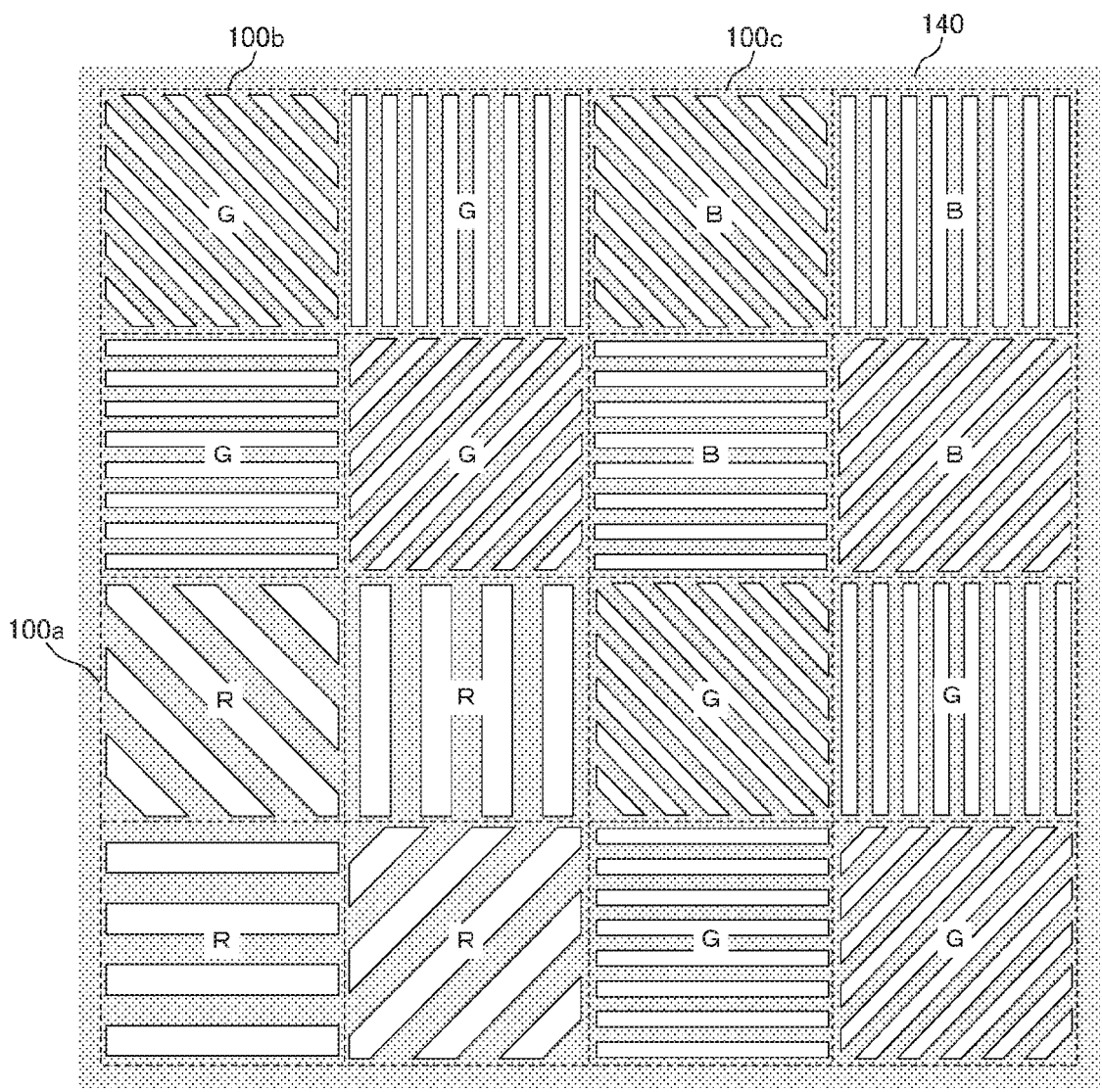
FIG. 8 is a diagram illustrating another arrangement example of the polarizer according to the first modification of the first embodiment of the present disclosure.

FIG. 8 is a diagram illustrating another arrangement example of the polarizer according to the first modification of the first embodiment of the present disclosure. Unlike FIG. 7, the figure illustrates an example in which the polarizers 140 formed with the same pitch are arranged in the green pixel 100b and the blue pixel 100c. Furthermore, the polarizer 140 of the red pixel 100a is formed with a larger pitch than that of the polarizers 140 of the green pixel 100b and the blue pixel 100c. With such an arrangement, the extinction ratio of the green pixel 100b can be improved.

Figure 9:
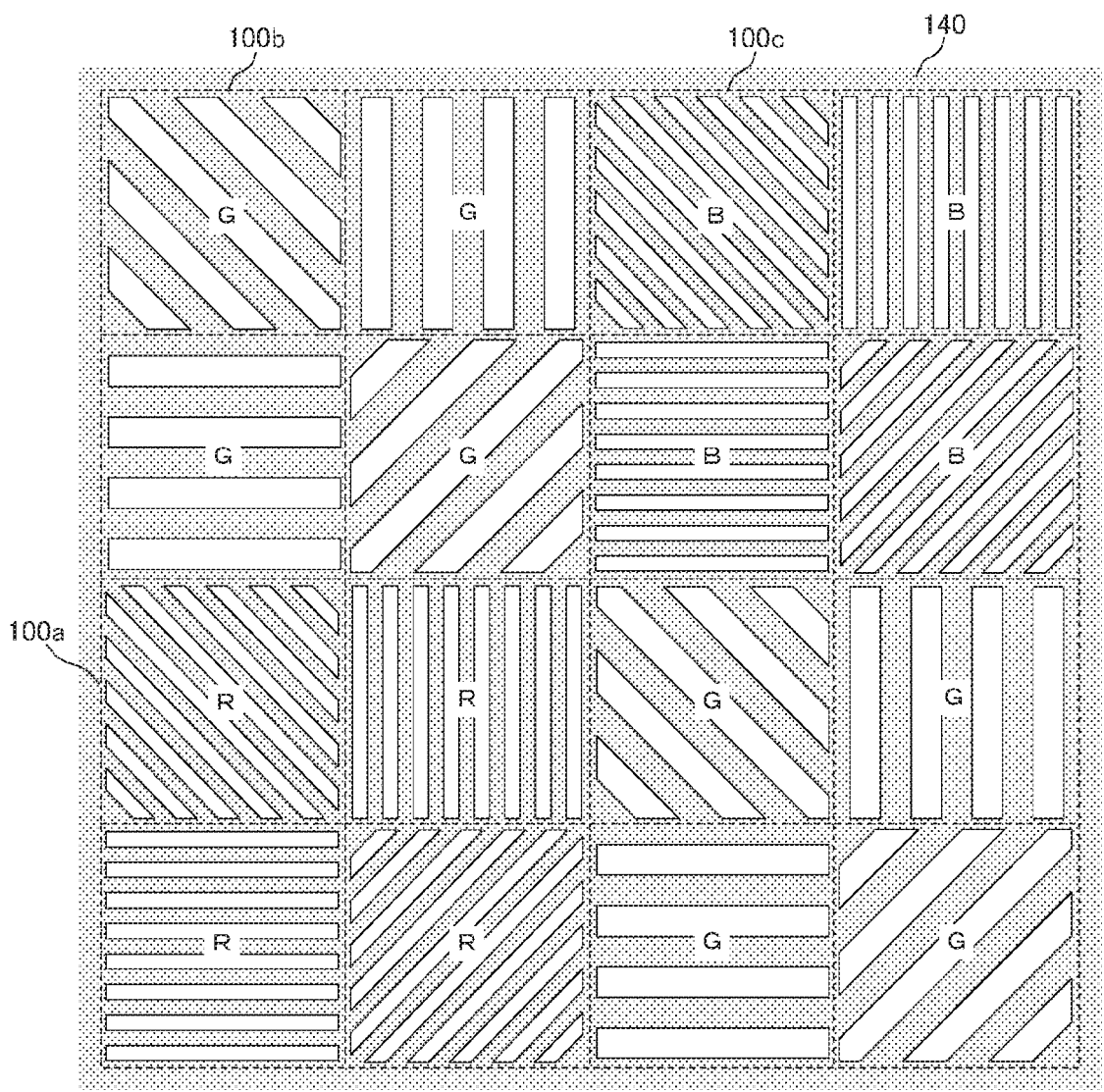
FIG. 9 is a diagram illustrating another arrangement example of the polarizer according to the first modification of the first embodiment of the present disclosure.

FIG. 9 is a diagram illustrating another arrangement example of the polarizer according to the first modification of the first embodiment of the present disclosure. The figure is an example in a case where the polarizer 140 of the red pixel 100a is formed with the same pitch as that of the polarizer 140 of the blue pixel 100c, and the polarizer 140 of the green pixel 100b is made larger than the polarizers 140 of the red pixel 100a and the blue pixel 100c. In the red pixel 100a, it is possible to increase the pitch of the polarizer 140 for obtaining the required extinction ratio. However, since the red light having a long wavelength is transmitted to a deep portion of the semiconductor substrate 121, there is a case where the red light is incident on the photoelectric conversion unit 101 of the adjacent red pixel 100a or the like to cause crosstalk, and the apparent extinction ratio of the adjacent red pixel 100a or the like is reduced.

Thus, as illustrated in the figure, it is possible to compensate for the decrease in extinction ratio by reducing the pitch of the polarizer 140 of the red pixel 100a. Furthermore, the pitch of the polarizer 140a can be reduced also in a case where the transmittance of incident light in the red pixel 100a is adjusted. As described above, reduction of the decrease in extinction ratio based on crosstalk and adjustment of the transmittance can be performed by adjusting polarization of the polarizer 140. Furthermore, since the extinction ratios of the red pixel 100a, the green pixel 100b, and the blue pixel 100c can be made uniform, it is possible to omit image signal (polarization information) correction processing depending on the extinction ratio in an imaging device in which the imaging element 1 is arranged.

As described above, the imaging element 1 of the first embodiment of the present disclosure adjusts the polarization of the polarizer 140 by changing the pitch of the light-reflecting layers 142 of the polarizer 140. As a result, it is possible to reduce the decrease in strength of the polarizer 140 arranged in the imaging element 1.

2. Second Embodiment

In the imaging element 1 of the first embodiment described above, the pitch is changed of the light-shielding lines 141 of the polarizer 140 arranged in the pixel 100. On the other hand, the imaging element 1 of a second embodiment of the present disclosure is different from the first embodiment described above in that the width is changed of the light-shielding line 141 of the polarizer 140.

[Shape of Polarizer]

Figure 10A:
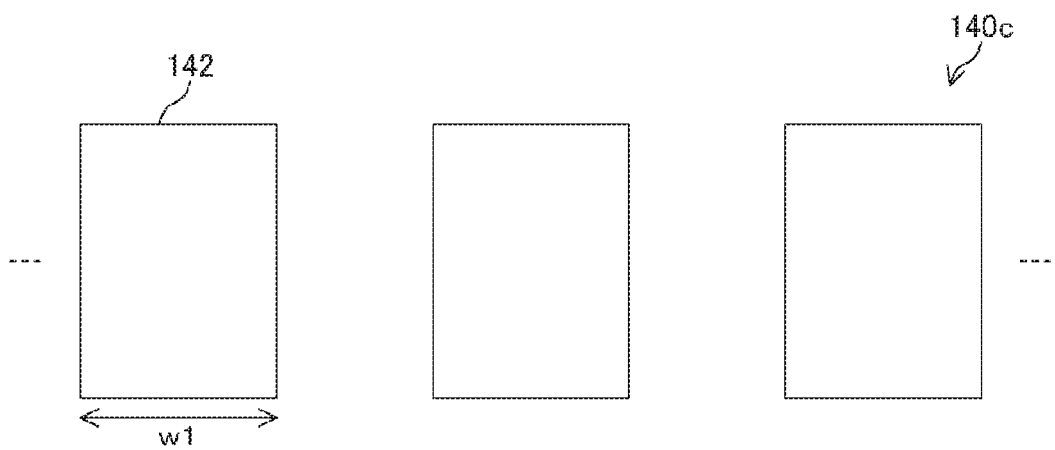
FIGS. 10A, 10B, and 10C are diagrams illustrating an example of a shape of a polarizer according to a second embodiment of the present disclosure.
Figure 10B:
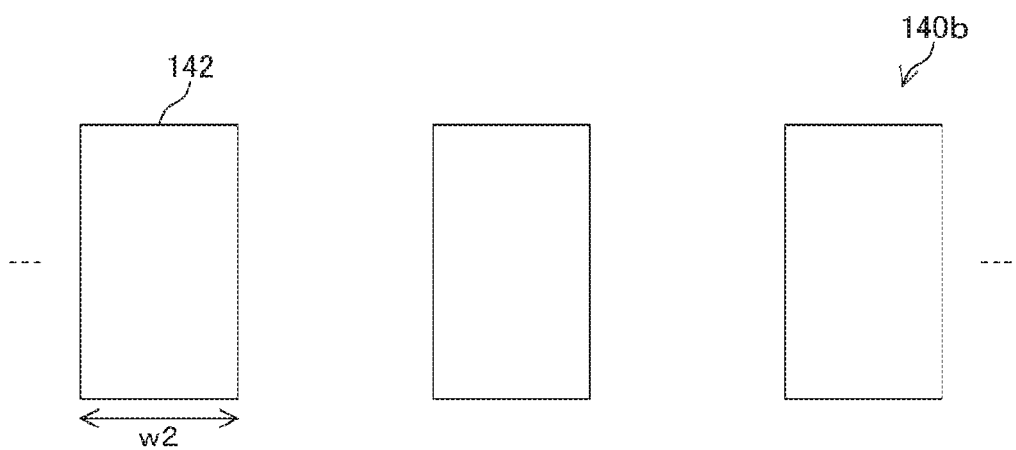
Figure 10C:
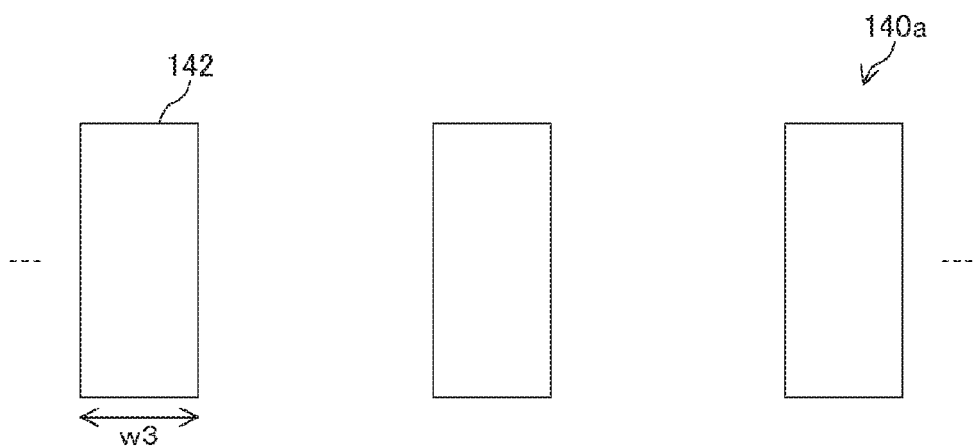

FIGS. 10A, 10B, and 10C are diagrams illustrating an example of a shape of the polarizer according to the second embodiment of the present disclosure. Similar to FIGS. 6A, 6B, and 6C, the figures are diagrams illustrating the simplified cross-sectional shapes of the light-reflecting layers 142. As illustrated in the figure, the widths of the light-reflecting layers 142 of the polarizer 140c, the polarizer 140b, and the polarizer 140a are w1, w2, and w3, respectively, and are larger widths in this order. Even in a case where the light-reflecting layers 142 in the polarizer 140 are formed with the same pitch, the extinction ratio can be increased by increasing the width of the light-reflecting layer 142. This is because, for example, resistance of the light-reflecting layer 142 is lowered, so that the vibration of the free electrons induced by the incident light is increased, and the reflection on the light-reflecting layer 142 is increased. Furthermore, since the width of the light-shielding line 141 can be increased, it is also possible to improve the strength.

[Characteristics of Polarizer]

Figure 11:
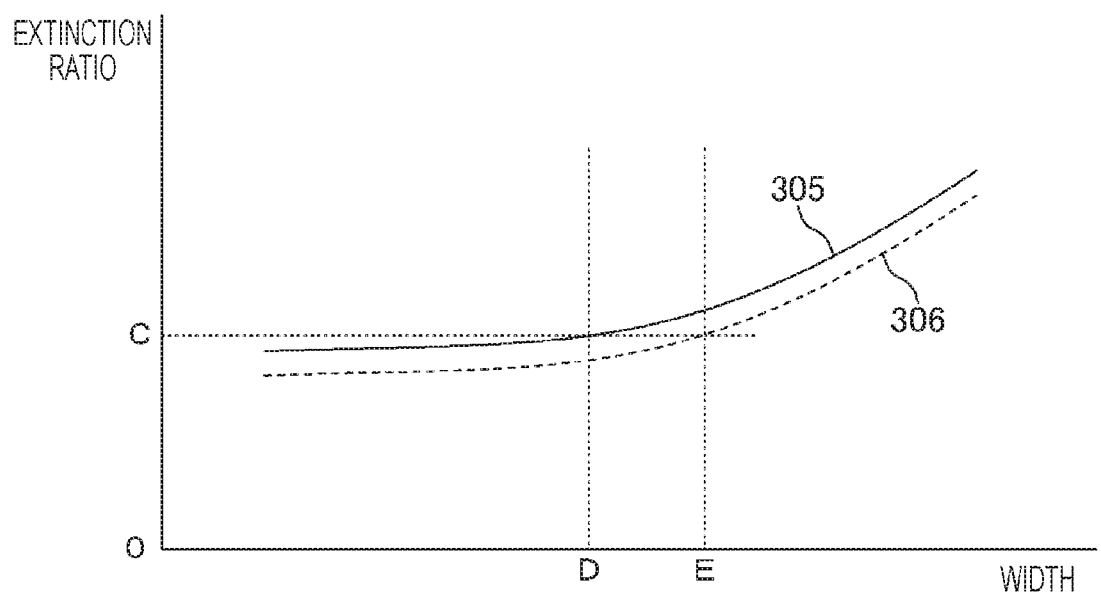
FIG. 11 is a diagram illustrating an example of characteristics of the polarizer according to the second embodiment of the present disclosure.

FIG. 11 is a diagram illustrating an example of characteristics of the polarizer according to the second embodiment of the present disclosure. The figure illustrates a relationship between the width of the light-reflecting layer 142 of the polarizer 140 and the extinction ratio of the polarizer 140. In the figure, the vertical axis represents the width of the light-reflecting layers 142 arranged at equal pitches. Furthermore, the solid line is a graph (graph 305) illustrating a characteristic of light having a long wavelength, and the dotted line is a graph (graph 306) illustrating a characteristic of light having a short wavelength. Other than this is similar to that of FIG. 5A. As illustrated in the figure, as the width of the light-reflecting layer 142 is larger, the extinction ratio is increased. Furthermore, in the graphs 305 and 306, pitches of the light-reflecting layers 142 for obtaining the extinction ratio "C" are "D" and "E", respectively, and the width can be made larger as the wavelength is shorter.

The configuration of the imaging element 1 other than the above is similar to the configuration of the imaging element 1 described in the first embodiment of the present disclosure, and the description thereof will not be repeated.

As described above, the imaging element 1 of the second embodiment of the present disclosure adjusts the polarization of the polarizer 140 by changing the width of the light-reflecting layer 142 of the polarizer 140. As a result, it is possible to reduce the decrease in strength of the polarizer 140 arranged in the imaging element 1.

3. Third Embodiment

In the imaging element 1 of the first embodiment described above, the pitch is changed of the light-shielding lines 141 of the polarizer 140 arranged in the pixel 100. On the other hand, the imaging element 1 of a third embodiment of the present disclosure is different from the first embodiment described above in that the height of the light-shielding line 141 of the polarizer 140 is changed.

[Shape of Polarizer]

Figure 12A:
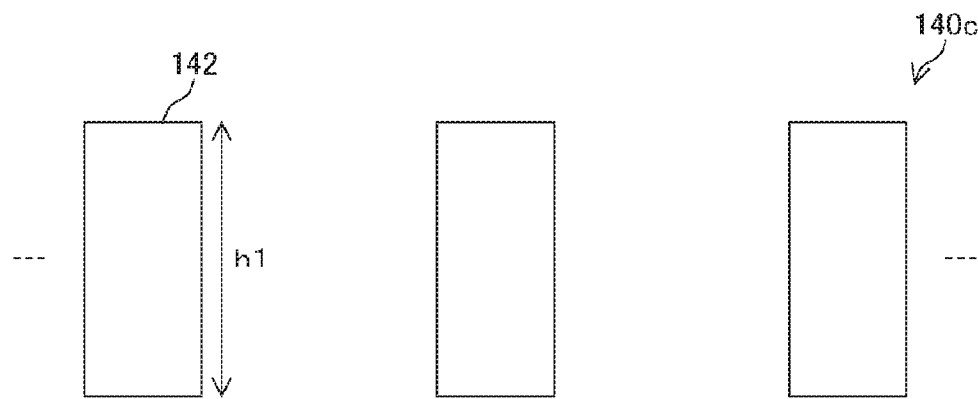
FIGS. 12A, 12B, and 12C are diagrams illustrating an example of a shape of a polarizer according to a third embodiment of the present disclosure.
Figure 12B:
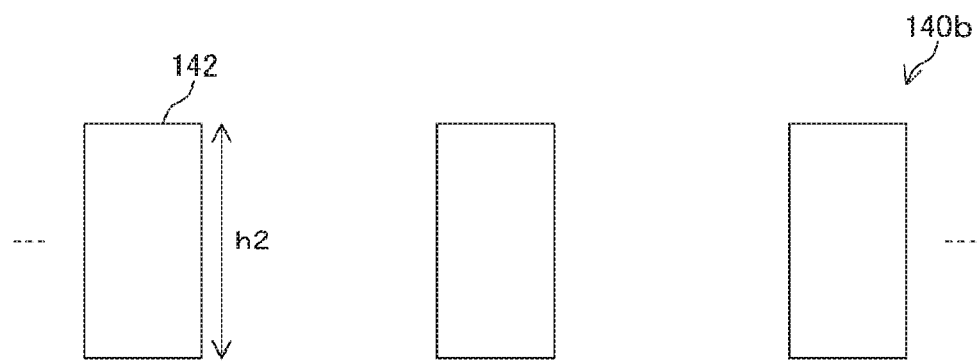
Figure 12C:
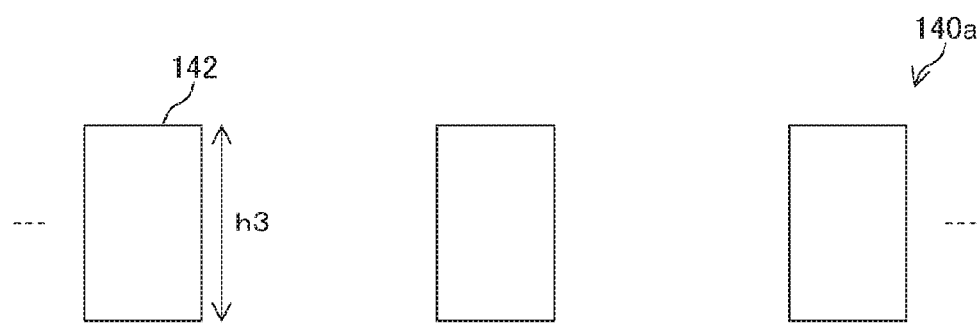

FIGS. 12A, 12B, and 12C are diagrams illustrating an example of a shape of the polarizer according to the third embodiment of the present disclosure. Similar to FIGS. 6A, 6B, and 6C, the figures are diagrams illustrating the simplified cross-sectional shapes of the light-reflecting layers 142. As illustrated in the figure, the heights of the light-reflecting layers 142 of the polarizer 140c, the polarizer 140b, and the polarizer 140a are h1, h2, and h3, respectively, and are greater heights in this order. Even in a case where the light-reflecting layers 142 in the polarizer 140 are formed with the same pitch, the extinction ratio can be increased by increasing the height of the light-reflecting layer 142. This is because the resistance of the light-reflecting layer 142 is lowered, similarly to a case where the width of the light-reflecting layer 142 is increased. Note that, in a case where the height of the light-reflecting layer 142 is reduced like the polarizer 140a in the figure, it is possible to reduce an aspect ratio of the light-shielding line 141 and also possible to improve the strength.

The configuration of the imaging element 1 other than the above is similar to the configuration of the imaging element 1 described in the first embodiment of the present disclosure, and the description thereof will not be repeated.

As described above, the imaging element 1 of the third embodiment of the present disclosure adjusts the polarization of the polarizer 140 by changing the height of the light-reflecting layer 142 of the polarizer 140. As a result, it is possible to reduce the decrease in strength of the polarizer 140 arranged in the imaging element 1.

4. Fourth Embodiment

In the imaging element 1 of the first embodiment described above, the pitch is changed of the light-shielding lines 141 of the polarizer 140 arranged in the pixel 100. On the other hand, the imaging element 1 of a fourth embodiment of the present disclosure is different from the first embodiment described above in that the shape of the light-shielding line 141 of the polarizer 140 is further changed.
[Shape of Polarizer]

Figure 13A:
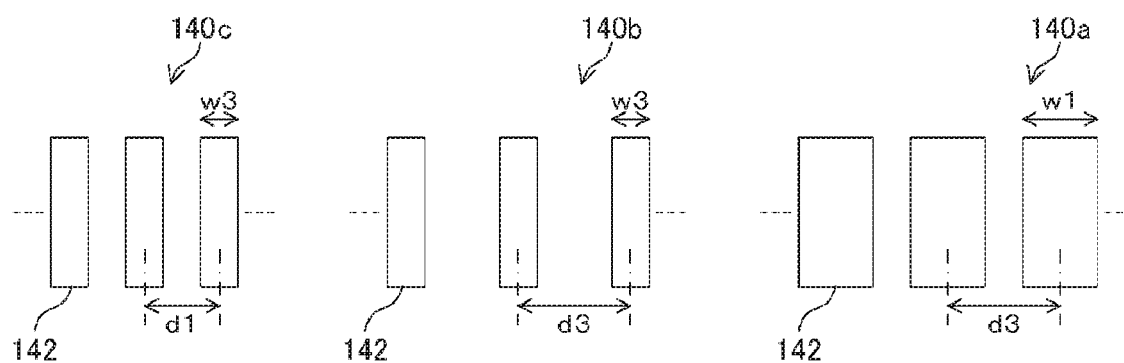
FIGS. 13A and 13B are diagrams illustrating an example of a shape of a polarizer according to a fourth embodiment of the present disclosure.
Figure 13B:
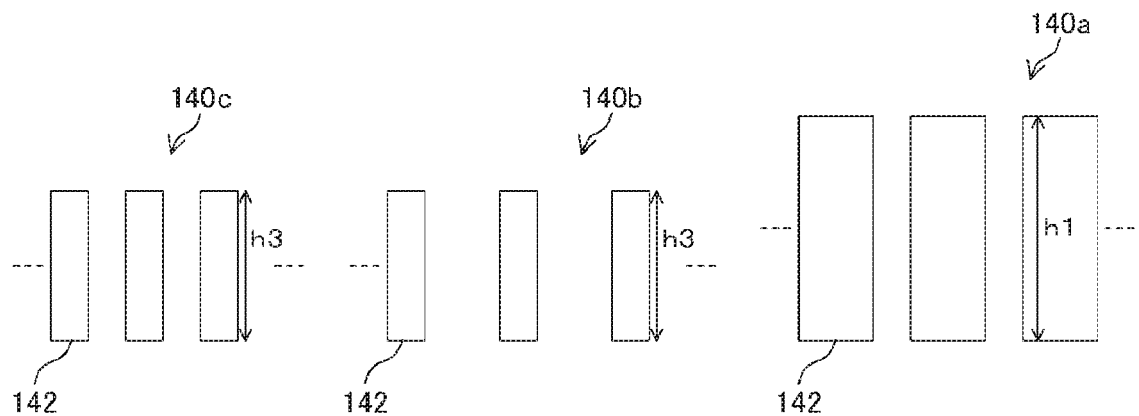

FIGS. 13A and 13B are diagrams illustrating an example of a shape of the polarizer according to the fourth embodiment of the present disclosure. Similar to FIGS. 6A, 6B, and 6C, the figures are diagrams illustrating the simplified cross-sectional shapes of the light-reflecting layers 142. FIG. 13A is a diagram illustrating an example in a case where the pitch and the width of the light-reflecting layers 142 are changed depending on the wavelength of incident light. In FIG. 13A, in the polarizers 140b and 140a, the light-reflecting layers 142 are arranged at the same pitch (d3) and also arranged at the pitch larger than the pitch (d1) of the light-reflecting layers 142 of the polarizer 140c. On the other hand, in the polarizers 140c and 140b, the light-reflecting layer 142 is formed with the same width (w3) and also formed with the width smaller than the width (w1) of the light-reflecting layer 142 of the polarizer 140a.

As described in FIGS. 6A, 6B, and 6C, the polarizer 140a of the red pixel 100a can have a larger pitch than the polarizers 140 of the green pixel 100b and the blue pixel 100c. However, as described in FIG. 9, the decrease in extinction ratio based on crosstalk may occur in the red pixel 100a. Thus, the pitch of the light-reflecting layers 142 of the polarizer 140a in the red pixel 100a is made the same as that of the light-reflecting layers 142 of the polarizer 140b in the green pixel 100b, and the width of the light-reflecting layer 142 is increased. As a result, it is possible to compensate for the decrease in extinction ratio of the polarizer 140a in the red pixel 100a. Furthermore, the pitch of the polarizer 140a of the red pixel 100a can be made larger than that of the polarizer 140c of the blue pixel 100c, and the decrease in strength can be reduced.

FIG. 13B is an example in a case where the height of the light-reflecting layer 142 of the polarizer 140a in the red pixel 100a is further changed. In the polarizer 140a of FIG. 13B, the light-reflecting layer 142 is formed with the height (h1) higher than the height (h3) of the light-reflecting layer 142 of the polarizers 140c and 140b. As a result, it is possible to further compensate for the decrease in extinction ratio of the polarizer 140a in the red pixel 100a.

The configuration of the imaging element 1 other than the above is similar to the configuration of the imaging element 1 described in the first embodiment of the present disclosure, and the description thereof will not be repeated.

As described above, the imaging element 1 of the fourth embodiment of the present disclosure adjusts the polarization of the polarizer 140 by changing the pitch and shape of the light-reflecting layers 142 of the polarizer 140. As a result, it is possible to compensate for the decrease in extinction ratio of the polarizer 140 arranged in the imaging element 1.

5. Fifth Embodiment

In the imaging element 1 of the first embodiment described above, there is a gap between the light-shielding lines 141 of the polarizer 140 arranged in the pixel 100. On the other hand, the imaging element 1 of a fifth embodiment of the present disclosure is different from the first embodiment described above in that an insulator is arranged between the light-shielding lines 141 of the polarizer 140.
[Shape of Polarizer]

Figure 14:
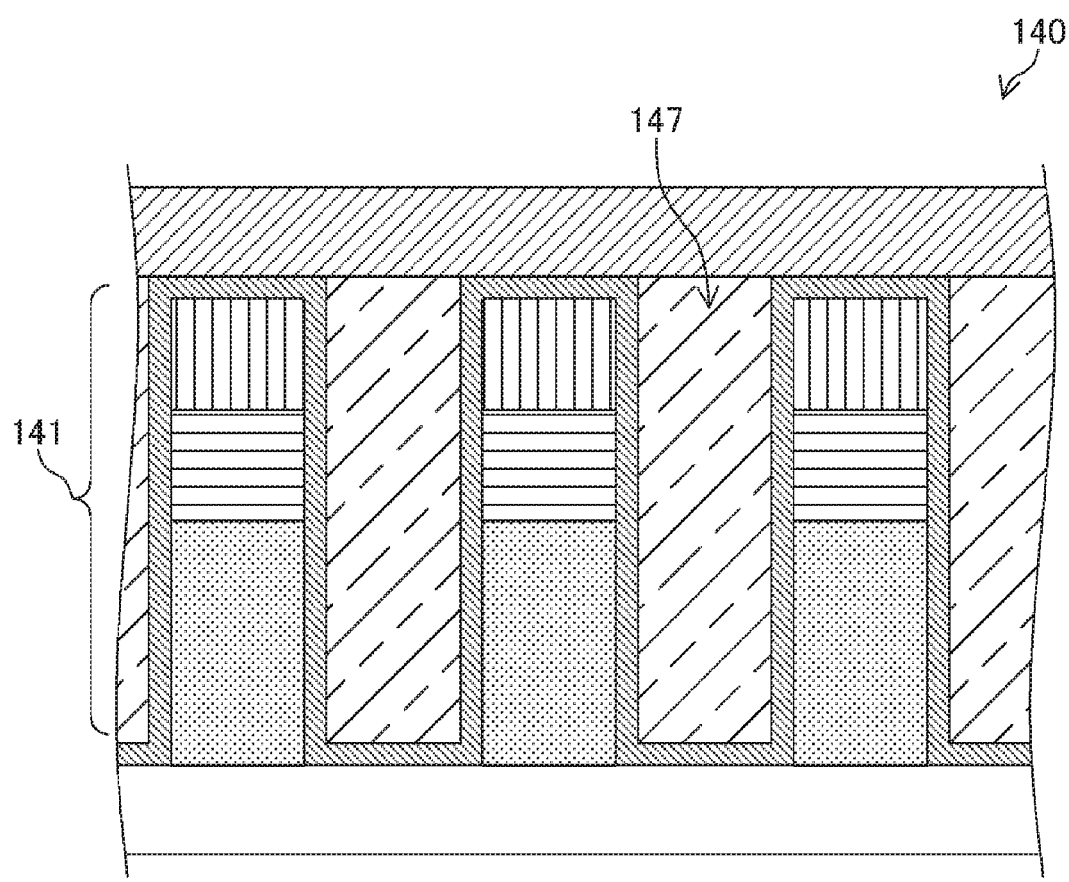
FIG. 14 is a diagram illustrating a configuration example of the polarizer according to a fifth embodiment of the present disclosure.

FIG. 14 is a diagram illustrating a configuration example of the polarizer according to the fifth embodiment of the present disclosure. Similar to FIG. 3, the figure is a diagram illustrating the shape of the polarizer 140. The polarizer 140 in the figure is different from the polarizer 140 described in FIG. 3 in that an insulator 147 is arranged between the light-shielding lines 141.

The insulator 147 includes a material having high insulation, and insulates the light-reflecting layers 142 from each other. By arranging the insulator 147 between the light-shielding lines 141, the strength of the polarizer 140 can be improved. The insulator 147 can include, for example, an oxide such as $SiO_2$ or a nitride such as SiN. Furthermore, the insulator 147 can include a transparent resin such as an acrylic resin. Such a polarizer 140 can be formed, for example, by forming the plurality of light-shielding lines 141 described in FIG. 3 and then embedding the material of the insulator 147 between the light-shielding lines 141. Furthermore, the polarizer 140 can also be formed, for example, by forming a material film of the insulator 147 and then forming a groove at a position where the light-shielding line 141 is formed, and embedding the light-reflecting layer 142 and the like in the groove.

Furthermore, by applying the insulator 147 having a different refractive index to the polarizer 140, the extinction ratio of the polarizer 140 can be adjusted. Specifically, the polarizer 140 in which the gap 146 is arranged between the light-shielding lines 141 illustrated in FIG. 3 is used as the polarizer 140c of the blue pixel 100c, and the polarizer 140 of the figure is applied to the polarizer 140 of the green pixel 100b and the red pixel 100a. The extinction ratio of the polarizer 140 depends on a refractive index of a member arranged between the light-shielding lines 141, and by arranging a member having a low refractive index, the extinction ratio can be increased. Since the refractive index of the insulator 147 is greater than the refractive index of the gap 146, the extinction ratio is changed with respect to the blue pixel 100c by applying the polarizer 140 in which the insulator 147 is arranged to the green pixel 100b and the red pixel 100a.

Furthermore, it is also possible to apply the insulator 147 including, for example, $SiO_2$ to the polarizer 140c of the blue pixel 100c, and apply the insulator 147 including, for example, SiN to the polarizer 140 of the green pixel 100b and the red pixel 100a. Since the refractive index of SiN is greater than that of $SiO_2$, the extinction ratio can be changed with respect to the blue pixel 100c by applying the polarizer 140 to which the insulator 147 including SiN is applied to the green pixel 100b and the red pixel 100a.

Furthermore, it is also possible to change the transmittance of the polarizer 140 by applying the insulator 147 having a different refractive index to the polarizer 140.

The configuration of the imaging element 1 other than the above is similar to the configuration of the imaging element 1 described in the first embodiment of the present disclosure, and the description thereof will not be repeated.

As described above, the imaging element 1 of the fifth embodiment of the present disclosure can adjust the polarization of the polarizer 140 and also improve the strength of the polarizer 140 by arranging an insulator between the light-shielding lines 141 of the polarizer 140.

6. Sixth Embodiment

In the imaging element 1 of the first embodiment described above, the polarizer 140 is arranged in all the pixels 100 arranged in the pixel array unit 10. On the other hand, the imaging element 1 of a sixth embodiment of the present disclosure is different from the first embodiment described above in that pixels in which the polarizer 140 is omitted are further arranged in the pixel array unit 10.

[Configuration of Pixel Array Unit]

Figure 15:
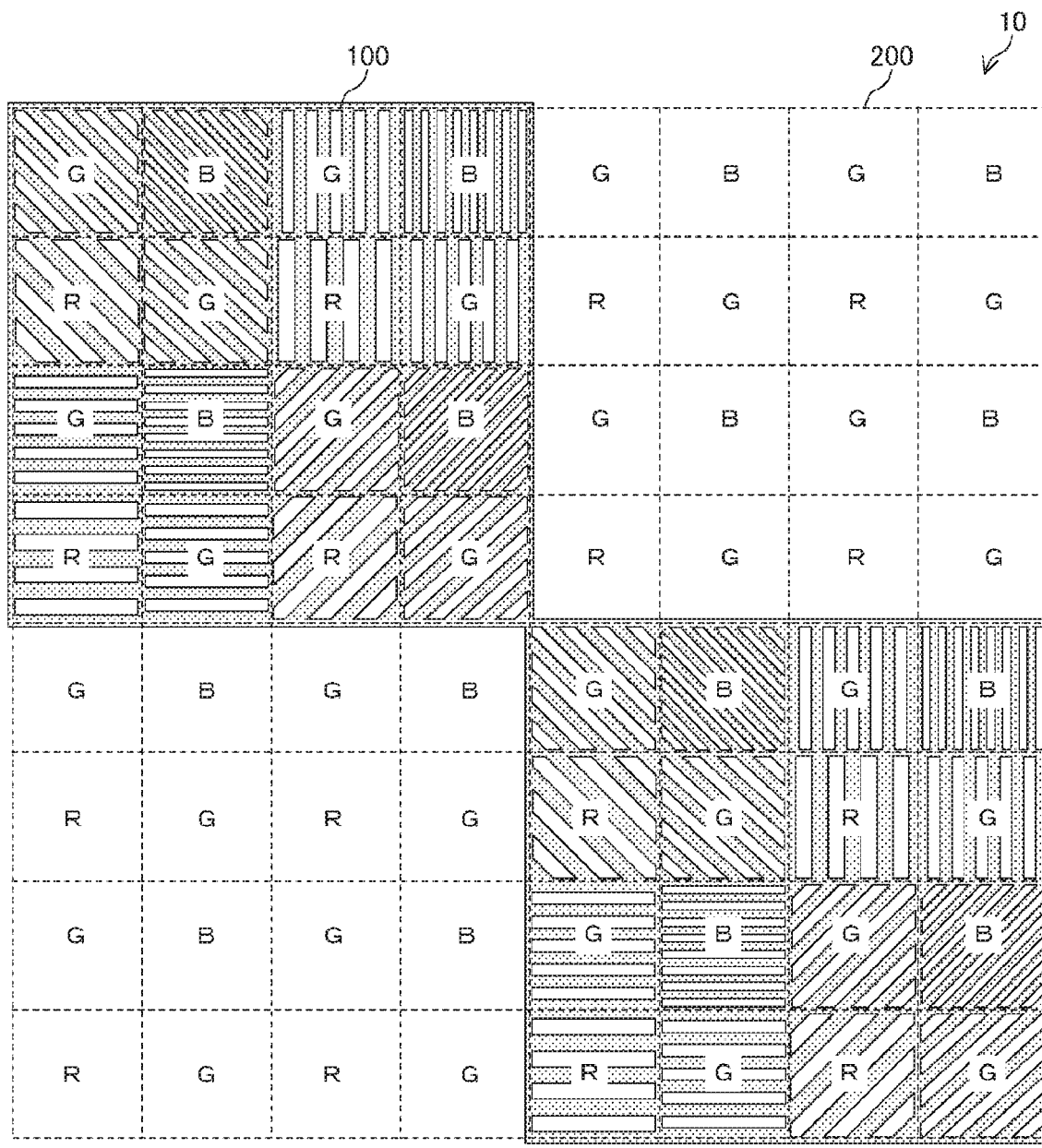
FIG. 15 is a diagram illustrating a configuration example of a pixel array unit according to a sixth embodiment of the present disclosure.

FIG. 15 is a diagram illustrating a configuration example of the pixel array unit according to the sixth embodiment of the present disclosure. Similar to FIG. 3, the figure is a diagram illustrating the shape of the polarizer 140 in the pixel 100. Furthermore, in the figure, a pixel 200 is arranged in addition to the pixel 100. The pixel 200 is a pixel in which no polarizer is arranged, and is a pixel that only generates an image signal.

The pixel array unit 10 in the figure includes a region in which four pixels 100 in the Bayer array are arranged and a region in which four pixels 200 in the Bayer array are arranged that are arranged in a checkered pattern. By using the imaging element 1 including the pixels 100 and 200 as described above, it is possible to simultaneously acquire the image signal and polarization information.

The configuration of the imaging element 1 other than the above is similar to the configuration of the imaging element 1 described in the first embodiment of the present disclosure, and the description thereof will not be repeated.

As described above, the imaging element 1 of the sixth embodiment of the present disclosure can adjust the polarization of the polarizer 140 in the imaging element 1 including the pixel 100 and the pixel 200.

7. Application Example to Camera

The technology according to the present disclosure (the present technology) can be applied to various products. For example, the present technology may be implemented as an imaging element mounted on an imaging device such as a camera.

Figure 16:
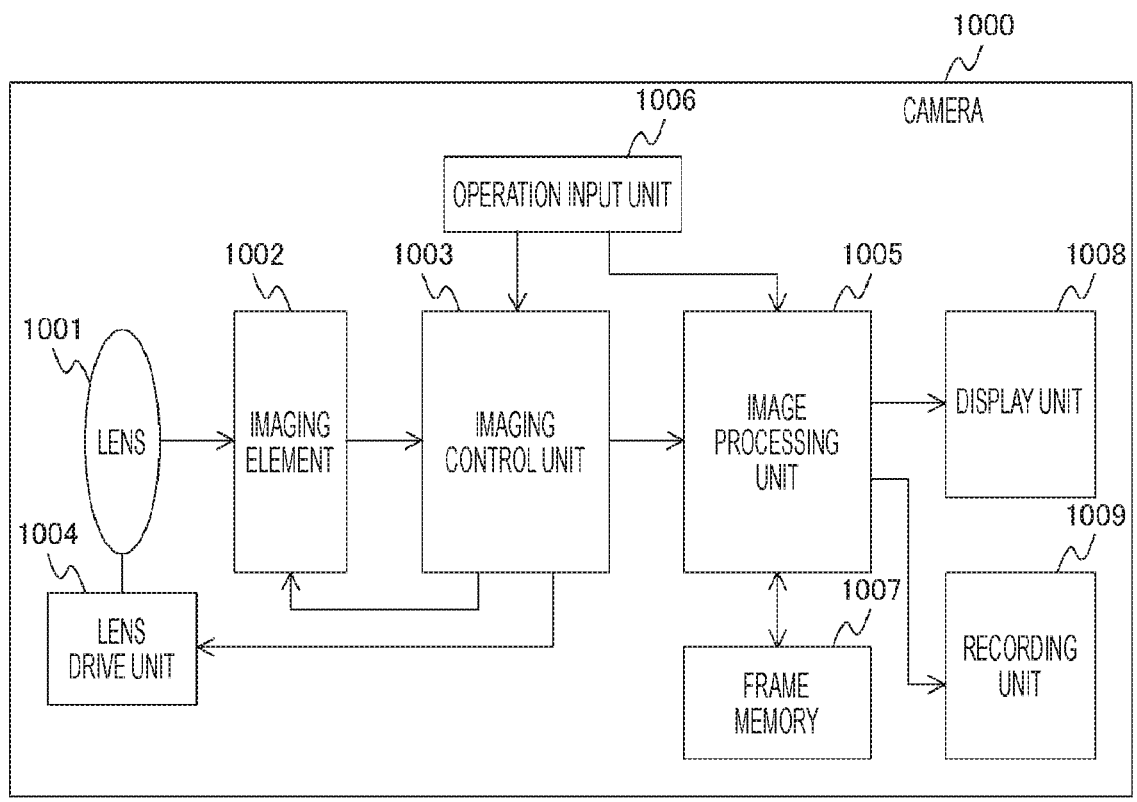
FIG. 16 is a block diagram illustrating a schematic configuration example of a camera that is an example of an imaging device to which the present technology can be applied.

FIG. 16 is a block diagram illustrating a schematic configuration example of a camera that is an example of an imaging device to which the present technology can be applied. A camera 1000 in the figure includes a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject and causes the light incident on the imaging element 1002 described later to form an image of the subject.

The imaging element 1002 is a semiconductor element that captures the light from the subject focused by the lens 1001. The imaging element 1002 generates an analog image signal depending on the light emitted thereto, converts the image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. Furthermore, the imaging control unit 1003 can perform autofocus in the camera 1000 on the basis of the image signal output from the imaging element 1002. Here, the autofocus is a system that detects a focal position of the lens 1001 and automatically performs adjustment. As the autofocus, a method can be used of detecting a focal position by detecting an image plane phase difference by a phase difference pixel arranged in the imaging element 1002 (image plane phase difference autofocus). Furthermore, a method can also be applied of detecting a position where contrast of an image is the highest as a focal position (contrast autofocus). The imaging control unit 1003 adjusts a position of the lens 1001 with the lens drive unit 1004 on the basis of the detected focal position, and performs autofocus. Note that, the imaging control unit 1003 can include, for example, a Digital Signal Processor (DSP) in which firmware is installed.

The lens drive unit 1004 drives the lens 1001 on the basis of the control of the imaging control unit 1003. The lens drive unit 1004 can drive the lens 1001 by changing the position of the lens 1001 by using a built-in motor.

The image processing unit 1005 processes the image signal generated by the imaging element 1002. Examples of this processing includes demosaicing for generating an image signal of a lacking color among image signals corresponding to red, green, and blue for each pixel, noise reduction for removing noise of the image signal, encoding of the image signal, and the like. The image processing unit 1005 can include, for example, a microprocessor in which firmware is installed.

The operation input unit 1006 accepts an operation input from a user of the camera 1000. As the operation input unit 1006, for example, a push button or a touch panel can be used. The operation input accepted by the operation input unit 1006 is transmitted to the imaging control unit 1003 and the image processing unit 1005. Thereafter, processing is started depending on the operation input, for example, processing of imaging the subject, and the like.

The frame memory 1007 is a memory that stores a frame that is an image signal for one screen. The frame memory 1007 is controlled by the image processing unit 1005, and holds the frame in a process of image processing.

The display unit 1008 displays an image processed by the image processing unit 1005. For the display unit 1008, for example, a liquid crystal panel can be used.

The recording unit 1009 records the image processed by the image processing unit 1005. As the recording unit 1009, for example, a memory card or a hard disk can be used.

In the above, the camera has been described to which the present invention can be applied. The present technology can be applied to the imaging element 1002 among the configurations described above. Specifically, the imaging element 1 described in FIG. 1 can be applied to the imaging element 1002. In this case, the image processing unit 1005 described above can process the image signal generated by the imaging element 1. For example, it is possible to perform processing of extracting polarization information from the image signal, and perform generation of an image based on the extracted polarization information. Note that, the image processing unit 1005 is an example of the processing circuit described in the claims. The camera 1000 is an example of the imaging device described in the claims.

Note that, here, the camera has been described as an example, but the technology according to the present invention may be applied to, for example, a monitoring device or the like.

8. Application Example to Endoscopic Surgical System

The technology according to the present disclosure can be applied to various products. For example, the technology according to the present disclosure may be applied to an endoscopic surgical system.

Figure 17:
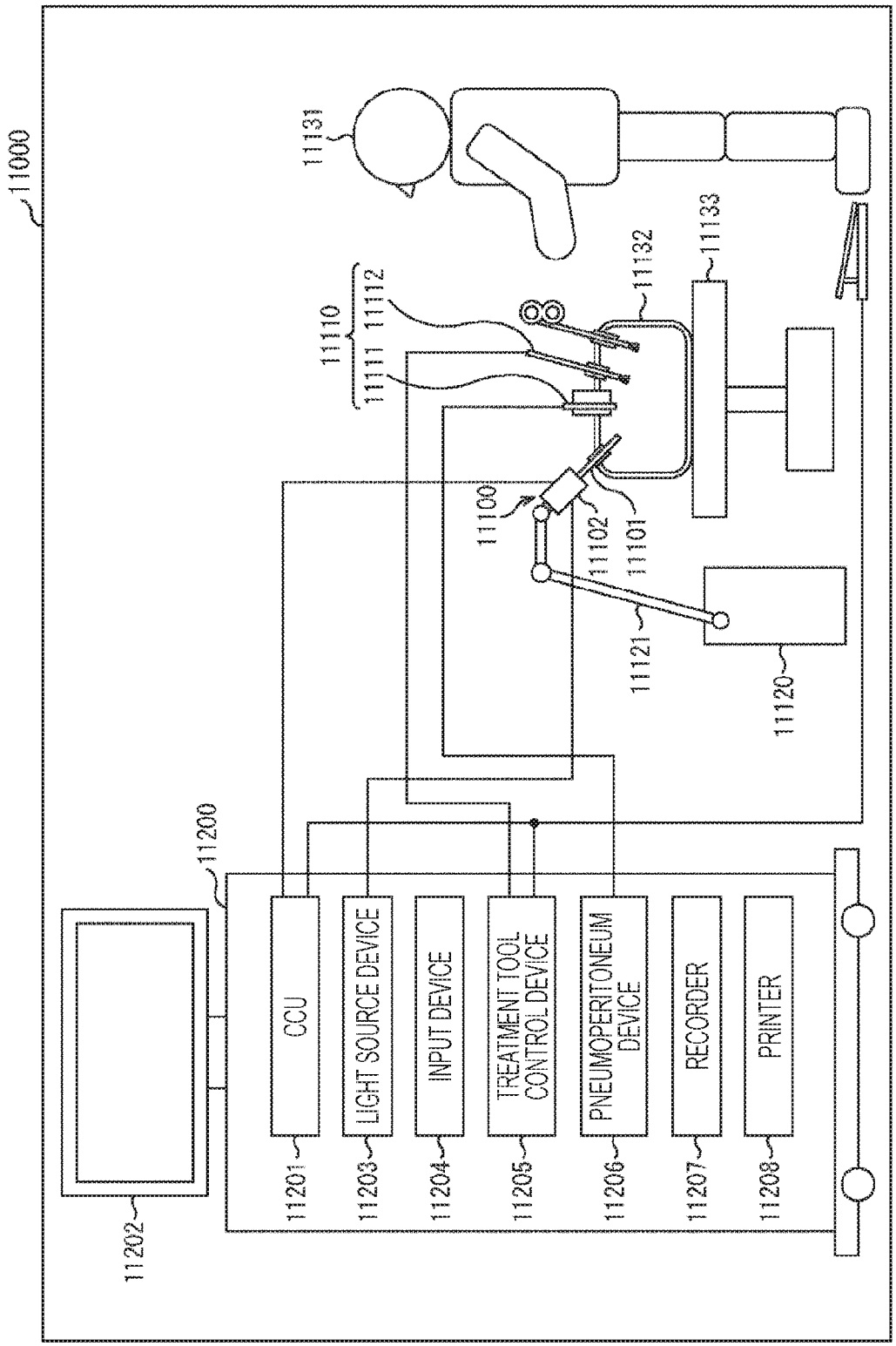
FIG. 17 is a diagram illustrating an example of a schematic configuration of an endoscopic surgical system.

FIG. 17 is a diagram illustrating an example of a schematic configuration of an endoscopic surgical system to which the technology according to the present disclosure can be applied.

FIG. 17 illustrates a state in which a surgeon (doctor) 11131 is performing surgery on a patient 11132 on a patient bed 11133 using an endoscopic surgical system 11000. As illustrated, the endoscopic surgical system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted.

The endoscope 11100 includes a lens barrel 11101 in which a region of a predetermined length from the distal end is inserted into the body cavity of the patient 11132, and a camera head 11102 connected to the proximal end of the lens barrel 11101. In the illustrated example, the endoscope 11100 formed as a so-called rigid scope including a rigid lens barrel 11101 is illustrated, but the endoscope 11100 may be formed as a so-called flexible scope including a flexible lens barrel.

At the distal end of the lens barrel 11101, an opening is provided into which an objective lens is fitted. A light source device 11203 is connected to the endoscope 11100, and light generated by the light source device 11203 is guided to the distal end of the lens barrel by a light guide extending inside the lens barrel 11101, and the light is emitted toward an observation target in the body cavity of the patient 11132 via the objective lens. Note that, the endoscope 11100 may be a forward-viewing endoscope, an oblique-viewing endoscope, or a side-viewing endoscope.

An optical system and an imaging element are provided inside the camera head 11102, and reflected light (observation light) from the observation target is focused on the imaging element by the optical system. The observation light is photoelectrically converted by the imaging element, and an electric signal corresponding to the observation light, that is, an image signal corresponding to the observation image is generated. The image signal is transmitted as RAW data to a camera control unit (CCU) 11201.

The CCU 11201 includes a central processing unit (CPU), a graphics processing unit (GPU), and the like, and comprehensively controls operation of the endoscope 11100 and a display device 11202. Moreover, the CCU 11201 receives the image signal from the camera head 11102 and applies various types of image processing to the image signal, for example, development processing (demosaic processing), and the like, for displaying the image based on the image signal.

The display device 11202 displays an image based on the image signal subjected to the image processing by the CCU 11201, by the control from the CCU 11201.

The light source device 11203 includes a light source, for example, a light emitting diode (LED) or the like, and supplies irradiation light for imaging a surgical portion or the like to the endoscope 11100.

An input device 11204 is an input interface to the endoscopic surgical system 11000. A user can input various types of information and instructions to the endoscopic surgical system 11000 via the input device 11204. For example, the user inputs an instruction or the like to change imaging conditions (type of irradiation light, magnification, focal length, and the like) for the endoscope 11100.

A treatment tool control device 11205 controls drive of the energy treatment tool 11112 for cauterization of tissue, incision, sealing of blood vessels, or the like. A pneumoperitoneum device 11206 injects a gas into the body cavity of the patient 11132 via the pneumoperitoneum tube 11111 to inflate the body cavity, for the purpose of ensuring a field of view by the endoscope 11100 and ensuring a working space of the surgeon. A recorder 11207 is a device capable of recording various types of information regarding surgery. A printer 11208 is a device capable of printing various types of information regarding surgery in various formats such as text, image, graph, and the like.

Note that, the light source device 11203 that supplies irradiation light for imaging a surgical portion to the endoscope 11100 can include a white light source including, for example, an LED, a laser light source, or a combination thereof. In a case where the white light source includes a combination of R, G, and B laser light sources, the output intensity and the output timing of each color (each wavelength) can be controlled with high accuracy, so that adjustment can be performed of the white balance of the captured image in the light source device 11203. Furthermore, in this case, it is also possible to capture an image corresponding to each of R, G, and B in time division by emitting the laser light from each of the R, G, and B laser light sources in time division to the observation target, and controlling drive of the imaging element of the camera head 11102 in synchronization with the emission timing. According to this method, a color image can be obtained without providing a color filter in the imaging element.

Furthermore, drive of the light source device 11203 may be controlled such that the intensity of light to be output is changed at predetermined time intervals. By controlling the drive of the imaging element of the camera head 11102 in synchronization with the change timing of the light intensity to acquire images in time division, and synthesizing the images, a high dynamic range image can be generated without so-called blocked up shadows or blown out highlights.

Furthermore, the light source device 11203 may be able to supply light of a predetermined wavelength band corresponding to special light observation. In the special light observation, for example, by using wavelength dependence of light absorption in a body tissue, by emitting narrow band light compared to irradiation light (in other words, white light) at the time of ordinary observation, so-called narrow band imaging is performed in which a predetermined tissue such as a blood vessel in a mucosal surface layer is imaged with high contrast. Alternatively, in the special light observation, fluorescence observation may be performed that obtain an image by fluorescence generated by emitting excitation light. In the fluorescence observation, it is possible to irradiate a body tissue with excitation light to observe the fluorescence from the body tissue (autofluorescence observation), or to locally inject a reagent such as indocyanine green (ICG) into a body tissue and irradiate the body tissue with excitation light corresponding to the fluorescence wavelength of the reagent to obtain a fluorescent image, for example. The light source device 11203 may be able to supply narrow band light and/or excitation light corresponding to such special light observation.

Figure 18:
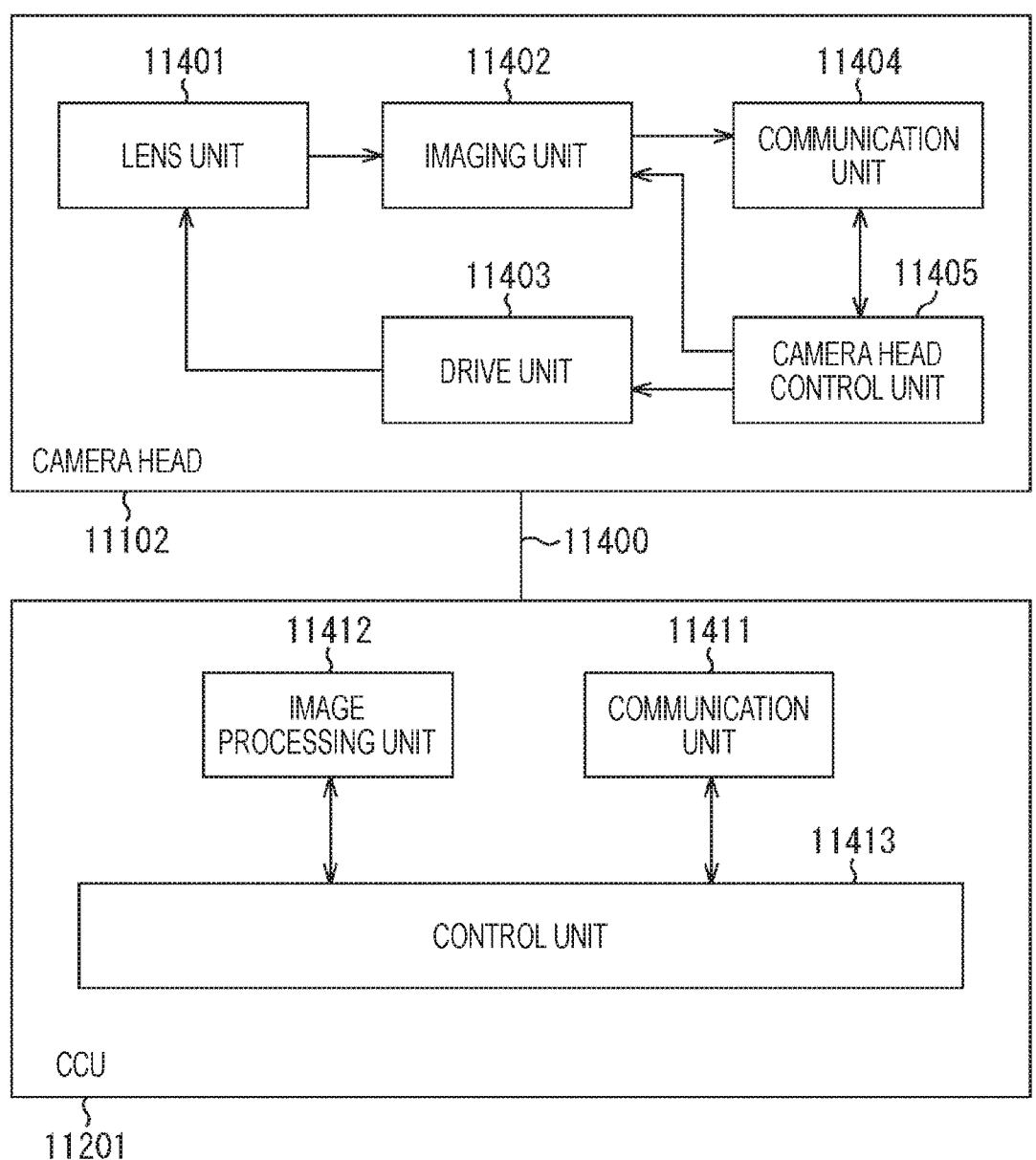
FIG. 18 is a block diagram illustrating an example of a functional configuration of a camera head and a CCU.

FIG. 18 is a block diagram illustrating an example of a functional configuration of the camera head 11102 and the CCU 11201 illustrated in FIG. 17.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. The observation light taken in from the distal end of the lens barrel 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging element constituting the imaging unit 11402 may be one (so-called single-chip) element, or a plurality of (so-called multi-chip) elements. In a case where the imaging unit 11402 includes the multi-chip type, for example, image signals corresponding to R, G, and B are generated by respective imaging elements, and the image signals are synthesized, whereby a color image may be obtained. Alternatively, the imaging unit 11402 may include a pair of imaging elements for acquiring right-eye and left-eye image signals corresponding to three-dimensional (3D) display. The 3D display is performed, whereby the surgeon 11131 can grasp the depth of living tissue in a surgical portion more accurately. Note that, in a case where the imaging unit 11402 includes the multi-chip type, a plurality of systems of the lens units 11401 can be provided corresponding to respective imaging elements.

Furthermore, the imaging unit 11402 is not necessarily provided in the camera head 11102. For example, the imaging unit 11402 may be provided inside the lens barrel 11101 immediately after the objective lens.

The drive unit 11403 includes an actuator and moves the zoom lens and the focus lens of the lens unit 11401 by a predetermined distance along the optical axis by control of the camera head control unit 11405. As a result, the magnification and the focus of the captured image by the imaging unit 11402 can be appropriately adjusted.

The communication unit 11404 includes a communication device for transmitting/receiving various types of information to/from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling drive of the camera head 11102 from the CCU 11201, and supplies the control signal to the camera head control unit 11405. The control signal includes information regarding imaging conditions, for example, information that specifies the frame rate of the captured image, information that specifies the exposure value at the time of imaging, and/or information that specifies the magnification and focus of the captured image.

Note that, the above-described imaging conditions such as the frame rate, exposure value, magnification, and focus may be appropriately specified by the user, or automatically set by the control unit 11413 of the CCU 11201 on the basis of the acquired image signal. In the latter case, a so-called auto exposure (AE) function, auto-focus (AF) function, and auto white balance (AWB) function are installed in the endoscope 11100.

The camera head control unit 11405 controls the drive of the camera head 11102 on the basis of the control signal from the CCU 11201 received via the communication unit 11404.

The communication unit 11411 includes a communication device for transmitting/receiving various types of information to/from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal and the control signal can be transmitted by electrical communication, optical communication, or the like.

The image processing unit 11412 performs various types of image processing on the image signal that is RAW data transmitted from the camera head 11102.

The control unit 11413 performs various types of control related to imaging of a surgical portion or the like by the endoscope 11100 and display of the captured image obtained by the imaging of the surgical portion or the like. For example, the control unit 11413 generates the control signal for controlling the drive of the camera head 11102.

Furthermore, the control unit 11413 causes the display device 11202 to display the captured image of the surgical portion or the like on the basis of the image signal subjected to the image processing by the image processing unit 11412. At this time, the control unit 11413 may recognize various objects in the captured image by using various image recognition technologies. For example, the control unit 11413 detects color, a shape of an edge, and the like of the object included in the captured image, thereby being able to recognize a surgical tool such as a forceps, a specific body part, bleeding, mist at the time of using the energy treatment tool 11112, or the like. When causing the display device 11202 to display the captured image, the control unit 11413 may cause the display device 11202 to superimpose and display various types of surgery assistance information on the image of the surgical portion by using the recognition result. The surgery assistance information is superimposed and displayed, and presented to the surgeon 11131, whereby the burden on the surgeon 11131 can be reduced, and the surgeon 11131 can reliably perform surgery.

The transmission cable 11400 connecting the camera head 11102 and the CCU 11201 together is an electric signal cable adaptable to communication of electric signals, an optical fiber adaptable to optical communication, or a composite cable thereof.

Here, in the illustrated example, communication is performed by wire using the transmission cable 11400, but communication between the camera head 11102 and the CCU 11201 may be performed wirelessly.

In the above, an example has been described of the endoscopic surgical system to which the technology according to the present disclosure can be applied. The technology according to the present disclosure can be applied to the imaging unit 11402 among the configurations described above. Specifically, the imaging element 1 of FIG. 1 can be applied to the imaging unit 10402. By applying the technology according to the present disclosure to the imaging unit 10402, it is possible to grasp a three-dimensional shape of a subject based on acquired polarization information, and the surgeon can reliably confirm the surgical portion.

Note that, the endoscopic surgical system has been described as an example here; however, the technology according to the present disclosure may be applied to others, for example, a microscopic surgical system, and the like.

9. Application Example to Mobile Body

The technology according to the present disclosure can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, or the like.

Figure 19:
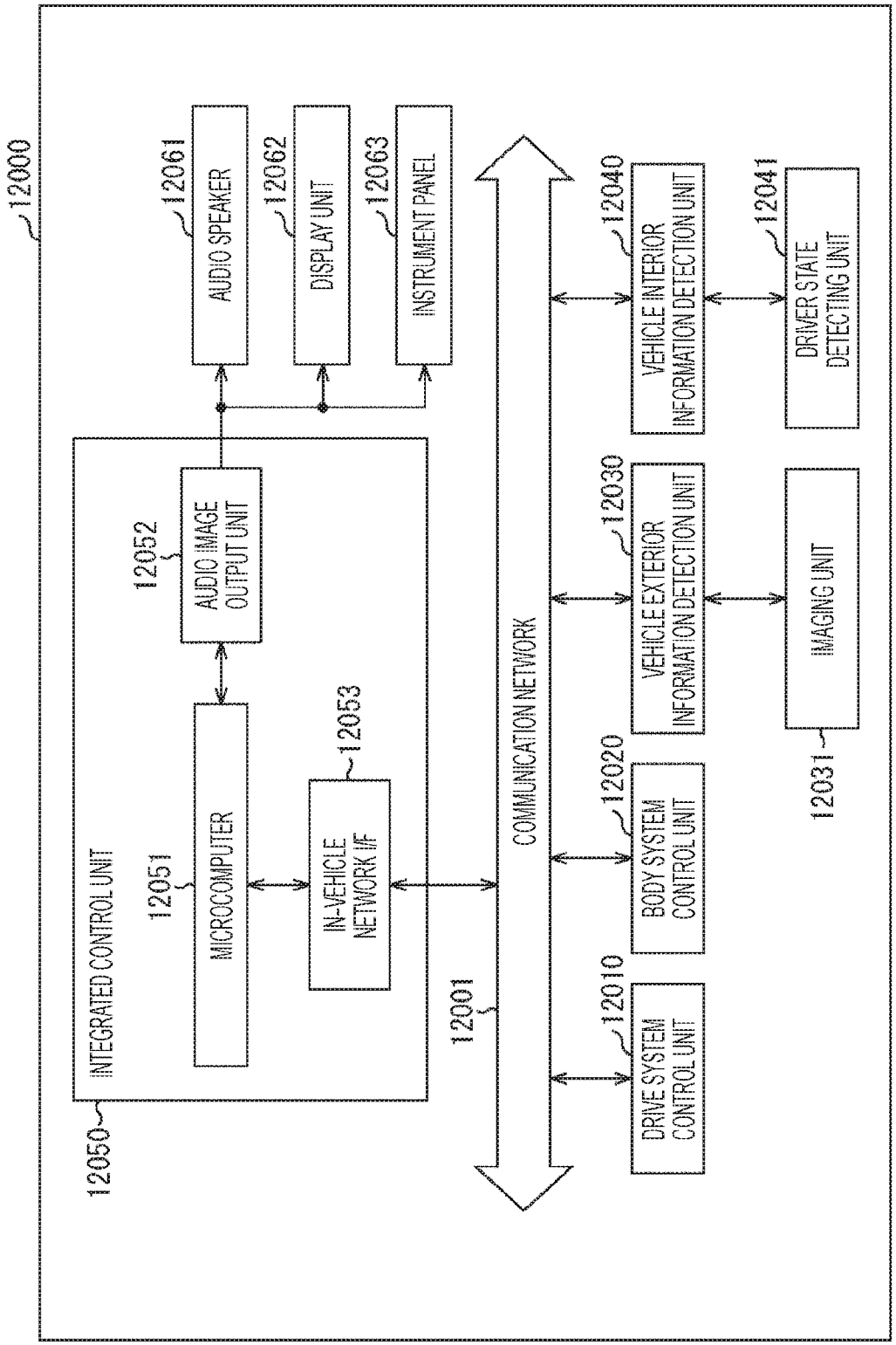
FIG. 19 is a block diagram illustrating an example of a schematic configuration of a vehicle control system.

FIG. 19 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 19, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, an audio image output unit 12052, and an in-vehicle network interface (I/F) 12053 are illustrated.

The drive system control unit 12010 controls operation of devices related to a drive system of a vehicle in accordance with various programs. For example, the drive system control unit 12010 functions as a control device of a driving force generating device for generating driving force of the vehicle, such as an internal combustion engine or a driving motor, a driving force transmitting mechanism for transmitting driving force to wheels, a steering mechanism for adjusting a steering angle of the vehicle, a braking device for generating braking force of the vehicle, and the like.

The body system control unit 12020 controls operation of various devices equipped on the vehicle body in accordance with various programs. For example, the body system control unit 12020 functions as a control device of a keyless entry system, a smart key system, a power window device, or various lamps such as a head lamp, a back lamp, a brake lamp, a turn signal lamp, and a fog lamp. In this case, to the body system control unit 12020, a radio wave transmitted from a portable device that substitutes for a key, or signals of various switches can be input. The body system control unit 12020 accepts input of these radio waves or signals and controls a door lock device, power window device, lamp, and the like of the vehicle.

The vehicle exterior information detection unit 12030 detects information on the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the image captured. The vehicle exterior information detection unit 12030 may perform object detection processing or distance detection processing on a person, a car, an obstacle, a sign, a character on a road surface, or the like, on the basis of the received image.

The imaging unit 12031 is an optical sensor that receives light and outputs an electric signal depending on an amount of light received. The imaging unit 12031 can output the electric signal as an image, or as distance measurement information. Furthermore, the light received by the imaging unit 12031 may be visible light, or invisible light such as infrared rays.

The vehicle interior information detection unit 12040 detects information on the inside of the vehicle. The vehicle interior information detection unit 12040 is connected to, for example, a driver state detecting unit 12041 that detects a state of a driver. The driver state detecting unit 12041 includes, for example, a camera that captures an image of the driver, and the vehicle interior information detection unit 12040 may calculate a degree of fatigue or a degree of concentration of the driver, or determine whether or not the driver is dozing, on the basis of the detection information input from the driver state detecting unit 12041.

The microcomputer 12051 can calculate a control target value of the driving force generating device, the steering mechanism, or the braking device on the basis of the information on the inside and outside of the vehicle acquired by the vehicle exterior information detection unit 12030 or the vehicle interior information detection unit 12040, and output a control command to the drive system control unit 12010. For example, the microcomputer 12051 can perform cooperative control aiming for implementing functions of advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control aiming for automatic driving that autonomously travels without depending on operation of the driver, or the like, by controlling the driving force generating device, the steering mechanism, the braking device, or the like on the basis of information on the periphery of the vehicle acquired by the vehicle exterior information detection unit 12030 or the vehicle interior information detection unit 12040.

Furthermore, the microcomputer 12051 can output a control command to the body system control unit 12020 on the basis of information on the outside of the vehicle acquired by the vehicle exterior information detection unit 12030. For example, the microcomputer 12051 can perform cooperative control aiming for preventing dazzling such as switching from the high beam to the low beam, by controlling the head lamp depending on a position of a preceding vehicle or an oncoming vehicle detected by the vehicle exterior information detection unit 12030.

The audio image output unit 12052 transmits at least one of audio and image output signals to an output device capable of visually or aurally notifying an occupant in the vehicle or the outside of the vehicle of information. In the example of FIG. 19, as the output device, an audio speaker 12061, a display unit 12062, and an instrument panel 12063 are illustrated. The display unit 12062 may include, for example, at least one of an on-board display or a head-up display.

Figure 20:
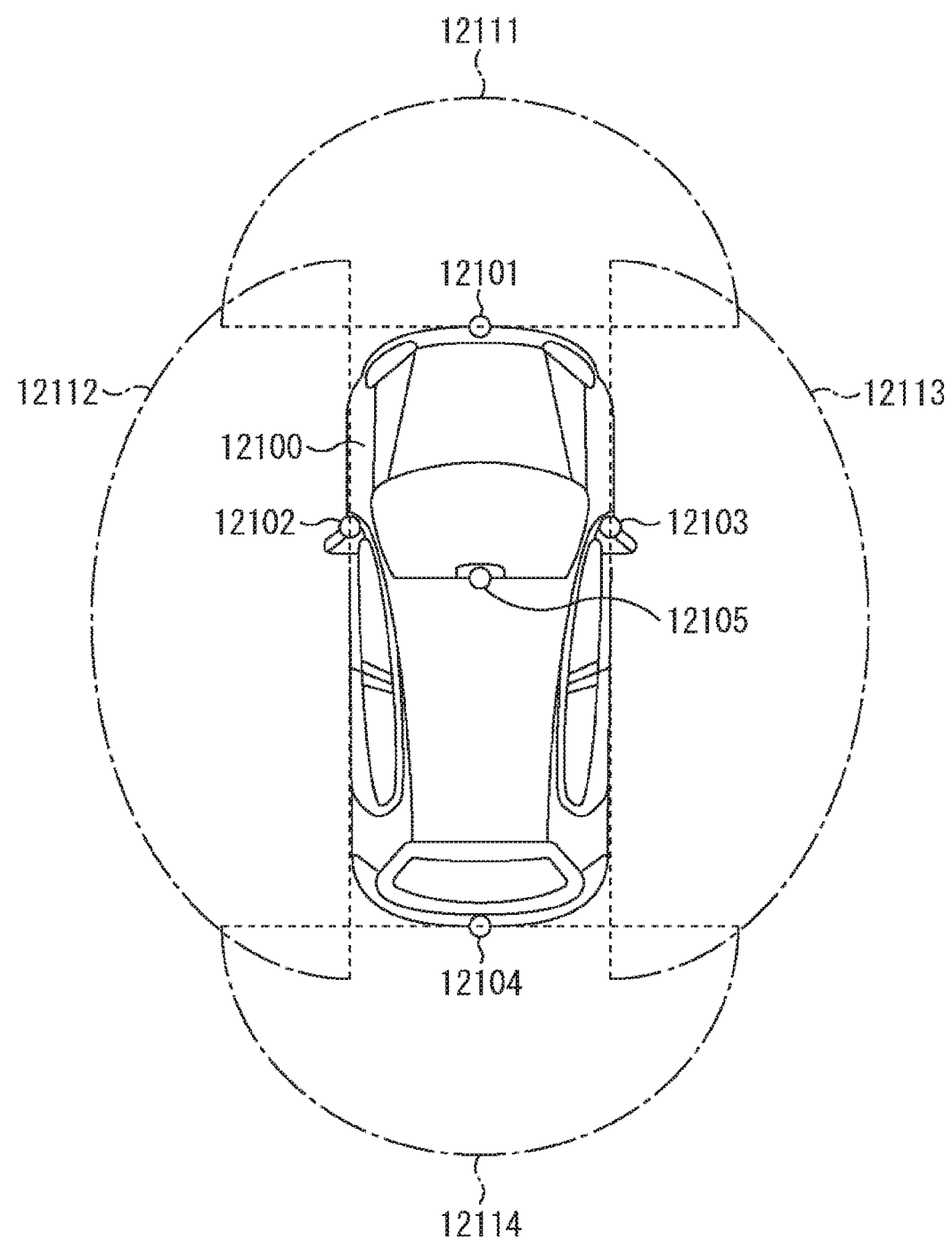
FIG. 20 is an explanatory diagram illustrating an example of installation positions of a vehicle exterior information detecting unit and an imaging unit.

FIG. 20 is a diagram illustrating an example of installation positions of the imaging unit 12031.

In FIG. 20, a vehicle 12100 includes imaging units 12101, 12102, 12103, 12104, and 12105 as the imaging unit 12031.

Imaging units 12101, 12102, 12103, 12104, and 12105 are provided at, for example, at a position of the front nose, the side mirror, the rear bumper, the back door, the upper part of the windshield in the vehicle interior, or the like, of a vehicle 12100. The imaging unit 12101 provided at the front nose and the imaging unit 12105 provided at the upper part of the windshield in the vehicle interior mainly acquire images ahead of the vehicle 12100. The imaging units 12102 and 12103 provided at the side mirrors mainly acquire images on the sides of the vehicle 12100. The imaging unit 12104 provided at the rear bumper or the back door mainly acquires an image behind the vehicle 12100. The front images acquired by the imaging units 12101 and 12105 are mainly used for detection of a preceding vehicle, a pedestrian, an obstacle, a traffic signal, a traffic sign, a lane, or the like.

Note that, FIG. 22 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, an imaging range 12114 indicates an imaging range of the imaging unit 12104 provided at the rear bumper or the back door. For example, image data captured by the imaging units 12101 to 12104 are superimposed on each other, whereby an overhead image is obtained of the vehicle 12100 viewed from above.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, on the basis of the distance information obtained from the imaging units 12101 to 12104, the microcomputer 12051 obtains a distance to each three-dimensional object within the imaging ranges 12111 to 12114, and a temporal change of the distance (relative speed to the vehicle 12100), thereby being able to extract, as a preceding vehicle, a three-dimensional object that is in particular a closest three-dimensional object on a traveling path of the vehicle 12100 and traveling at a predetermined speed (for example, greater than or equal to 0 km/h) in substantially the same direction as that of the vehicle 12100. Moreover, the microcomputer 12051 can set an inter-vehicle distance to be ensured in advance in front of the preceding vehicle, and can perform automatic brake control (including follow-up stop control), automatic acceleration control (including follow-up start control), and the like. As described above, it is possible to perform cooperative control aiming for automatic driving that autonomously travels without depending on operation of the driver, or the like.

For example, on the basis of the distance information obtained from the imaging units 12101 to 12104, the microcomputer 12051 can extract three-dimensional object data regarding the three-dimensional object by classifying the objects into a two-wheeled vehicle, a regular vehicle, a large vehicle, a pedestrian, and other three-dimensional objects such as a utility pole, and use the data for automatic avoidance of obstacles. For example, the microcomputer 12051 identifies obstacles in the periphery of the vehicle 12100 into an obstacle visually recognizable to the driver of the vehicle 12100 and an obstacle difficult to be visually recognized. Then, the microcomputer 12051 determines a collision risk indicating a risk of collision with each obstacle, and when the collision risk is greater than or equal to a set value and there is a possibility of collision, the microcomputer 12051 outputs an alarm to the driver via the audio speaker 12061 and the display unit 12062, or performs forced deceleration or avoidance steering via the drive system control unit 12010, thereby being able to perform driving assistance for collision avoidance.

At least one of the imaging units 12101 to 12104 may be an infrared camera that detects infrared rays. For example, the microcomputer 12051 can recognize a pedestrian by determining whether or not a pedestrian exists in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating a contour of an object to determine whether or not the object is a pedestrian. When the microcomputer 12051 determines that a pedestrian exists in the captured images of the imaging units 12101 to 12104 and recognizes the pedestrian, the audio image output unit 12052 controls the display unit 12062 so that a rectangular contour line for emphasis is superimposed and displayed on the recognized pedestrian. Furthermore, the audio image output unit 12052 may control the display unit 12062 so that an icon or the like indicating the pedestrian is displayed at a desired position.

In the above, an example has been described of the vehicle control system to which the technology according to the present disclosure can be applied. The technology according to the present disclosure can be applied to the imaging unit 12031 and the like, in the configuration described above. Specifically, the imaging element 1 of FIG. 1 can be applied to the imaging unit 12031. By applying the technology according to the present disclosure to the imaging unit 12031 and the like, it is possible to display a three-dimensional shape of a subject based on acquired polarization information, and obtain a captured image that is more easily viewed.

Lastly, the description of each of the embodiments described above is an example of the present disclosure, and the present disclosure is not limited to the embodiments described above. For this reason, it goes without saying that various changes other than the embodiments described above can be made depending on the design and the like as long as they do not deviate from the technical idea according to the present disclosure.

Note that, the present technology can also be configured as described below.

(1) An imaging element including a plurality of pixels each including a color filter that transmits light having a predetermined wavelength of incident light and a polarizer that performs polarization of the incident light, and generating an image signal based on the incident light transmitted through the color filter and the polarizer, in which the polarizer adjusts the polarization depending on the color filter in a corresponding one of the pixels of the imaging element.

(2) The imaging element according to (1), in which the polarizer adjusts the polarization depending on a wavelength of the incident light transmitted through the color filter.

(3) The imaging element according to (1) or (2), in which the polarizer adjusts the polarization by changing an extinction ratio.

(4) The imaging element according to (1) or (2), in which the polarizer adjusts the polarization by changing a transmittance of the incident light.

(5) The imaging element according to any of (1) to (4), in which the polarizer includes a wire grid including a plurality of strip-shaped conductors arranged at a predetermined pitch.

(6) The imaging element according to (5), in which the polarizer adjusts the polarization by changing the predetermined pitch.

(7) The imaging element according to (5), in which the polarizer adjusts the polarization by changing a width of the strip-shaped conductor.

(8) The imaging element according to (5), in which the polarizer adjusts the polarization by changing a height of the strip-shaped conductor.

(9) The imaging element according to (5), in which the polarizer includes an insulator arranged between the strip-shaped conductors adjacent to each other, and adjusts the polarization by changing a refractive index of the insulator.

(10) The imaging element according to (5), in which the polarizer includes a gap between the strip-shaped conductors adjacent to each other.

(11) An imaging device including:
a plurality of pixels each including a color filter that transmits light having a predetermined wavelength of incident light and a polarizer that performs polarization of the incident light, and generating an image signal based on the incident light transmitted through the color filter and the polarizer; and
a processing circuit that processes the generated image signal,
in which
the polarizer adjusts the polarization depending on the color filter in a corresponding one of the pixels of the imaging device.

REFERENCE SIGNS LIST

1 Imaging element
10 Pixel array unit
100, 100a, 100b, 100c Pixel
101 Photoelectric conversion unit
140, 140a, 140b, 140c Polarizer
141 Light-shielding line
142 Light-reflecting layer
143 Insulating layer
144 Light-absorbing layer
146 Gap
147 Insulator
160 Color filter
200 Pixel
1000 Camera
1002 Imaging element
1005 Image processing unit
10402, 12031, 12101 to 12105 Imaging unit

The invention claimed is:
1. An imaging element, comprising:
a plurality of pixels, wherein
each pixel of the plurality of pixels includes:
a color filter configured to transmit incident light having a specific wavelength, wherein the incident light is incident on the color filter; and
a polarizer configured to execute polarization of the incident light transmitted by the color filter of a respective pixel of the plurality of pixels,
each pixel of the plurality of pixels is configured to generate an image signal based on the polarized incident light,
the plurality of pixels includes a first pixel and a second pixel,
the polarizer in each pixel of the plurality of pixels includes a wire grid including a plurality of strip-shaped conductors,
the polarizer in the first pixel includes a first insulator between the strip-shaped conductors of the polarizer in the first pixel,
the polarizer in the second pixel includes a second insulator between the strip-shaped conductors of the polarizer in the second pixel,
the first insulator is different from the second insulator, and
the first insulator has a refractive index different from a refractive index of the second insulator.

2. The imaging element according to claim 1, wherein the polarizer is further configured to control the polarization based on the specific wavelength of the transmitted incident light.

3. The imaging element according to claim 1, wherein the polarizer is further configured to control the polarization based on an extinction ratio of the polarizer.

4. The imaging element according to claim 1, wherein the polarizer is further configured to control the polarization based on a transmittance of the incident light.

5. The imaging element according to claim 1, wherein
a first pitch between the plurality of strip-shaped conductors in the first pixel is different from a second pitch between the plurality of strip-shaped conductors in the second pixel, and
the polarizer in the first pixel is further configured to control the polarization based on the first pitch.

6. The imaging element according to claim 1, wherein
at least one strip-shaped conductor of the plurality of strip-shaped conductors in the first pixel has a width different from a width of at least one strip-shaped conductor of the plurality of strip-shaped conductors in the second pixel, and
the polarizer in the first pixel is further configured to control the polarization based on the width of the at least one strip-shaped conductor of the first pixel.

7. The imaging element according to claim 1, wherein
at least one strip-shaped conductor of the plurality of strip-shaped conductors in the first pixel has a height different from a height of at least one strip-shaped conductor of the plurality of strip-shaped conductors in the second pixel, and
the polarizer in the first pixel is further configured to control the polarization based on the height of the at least one strip-shaped conductor of the first pixel.

8. The imaging element according to claim 1, wherein the polarizer in the first pixel is further configured to execute the polarization based on the refractive index of the first insulator.

9. The imaging element according to claim 1, wherein the polarizer in a third pixel of the plurality of pixels includes a gap between the plurality of strip-shaped conductors of the polarizer in the third pixel.

10. An imaging device, comprising:
 a plurality of pixels, wherein
  each pixel of the plurality of pixels includes:
   a color filter configured to transmit incident light having a specific wavelength, wherein the incident light is incident on the color filter; and
   a polarizer configured to execute polarization of the incident light transmitted by the color filter of a respective pixel of the plurality of pixels,
  each pixel of the plurality of pixels is configured to generate an image signal based on the polarized incident light,
  the plurality of pixels includes a first pixel and a second pixel,
  the polarizer in each pixel of the plurality of pixels includes a wire grid including a plurality of strip-shaped conductors,
  the polarizer in the first pixel includes a first insulator between the strip-shaped conductors of the polarizer in the first pixel,
  the polarizer in the second pixel includes a second insulator between the strip-shaped conductors of the polarizer in the second pixel,
  the first insulator is different from the second insulator, and
  the first insulator has a refractive index different from a refractive index of the second insulator; and
 a processing circuit configured to process the generated image signal.

* * * * *